(12) United States Patent
Chang et al.

(10) Patent No.: US 11,811,010 B2
(45) Date of Patent: Nov. 7, 2023

(54) DISPLAY DEVICE AND METHOD OF FABRICATING THE SAME

(71) Applicant: Samsung Display Co., Ltd., Yongin-si (KR)

(72) Inventors: Chong Sup Chang, Hwaseong-si (KR); Hyun Ae Kim, Seoul (KR); Eui Kang Heo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 6 days.

(21) Appl. No.: 17/661,518

(22) Filed: Apr. 29, 2022

(65) Prior Publication Data

US 2022/0263002 A1 Aug. 18, 2022

Related U.S. Application Data

(62) Division of application No. 16/910,962, filed on Jun. 24, 2020, now Pat. No. 11,349,054.

(30) Foreign Application Priority Data

Aug. 28, 2019 (KR) .......................... 10-2019-0105691

(51) Int. Cl.
*H01L 33/62* (2010.01)
*H01L 25/075* (2006.01)
*H01L 29/786* (2006.01)
*H01L 27/12* (2006.01)

(52) U.S. Cl.
CPC .......... *H01L 33/62* (2013.01); *H01L 25/0753* (2013.01); *H01L 27/1214* (2013.01); *H01L 29/78633* (2013.01); *H01L 2933/0066* (2013.01)

(58) Field of Classification Search
CPC ................. H01L 33/62; H01L 25/0753; H01L 29/78633; H01L 27/1214; H01L 2933/0066; H01L 2933/005; H01L 33/54; H01L 25/167; H01L 27/323; H01L 27/3211; H01L 27/3246; H01L 27/3248;
(Continued)

(56) References Cited

U.S. PATENT DOCUMENTS

| 11,127,724 B2* | 9/2021 | Bae ........................ H01L 33/005 |
| 11,610,934 B2* | 3/2023 | Kang ...................... H01L 27/15 |
| 2018/0019369 A1* | 1/2018 | Cho ......................... H05K 1/11 |

(Continued)

*Primary Examiner* — Victor A Mandala
(74) *Attorney, Agent, or Firm* — Lewis Roca Rothgerber Christie LLP

(57) ABSTRACT

A display device includes a substrate, a first electrode and a second electrode which are spaced apart from each other on the substrate, a first insulating pattern on the substrate to cover at least a portion of each of the first electrode and the second electrode, a light emitting element between the first electrode and the second electrode on the first insulating pattern, a first contact electrode in contact with the first electrode and one end portion of the light emitting element, a second contact electrode in contact with the second electrode and another end portion of the light emitting element, and a second insulating pattern on the light emitting element and of which at least a portion is in contact with each of the first contact electrode and the second contact electrode, wherein the second insulating pattern includes a first upper surface not in contact with the first contact electrode or the second contact electrode.

4 Claims, 23 Drawing Sheets

(58) Field of Classification Search
CPC . H01L 27/3262; H01L 27/156; H01L 27/124; H01L 33/005; H01L 27/1259
See application file for complete search history.

(56) References Cited

U.S. PATENT DOCUMENTS

| | | | |
|---|---|---|---|
| 2018/0019377 A1* | 1/2018 | Kim | H01L 33/38 |
| 2018/0175009 A1* | 6/2018 | Kim | H01L 25/167 |
| 2019/0115513 A1* | 4/2019 | Im | H01L 33/06 |
| 2019/0172819 A1* | 6/2019 | Bae | H01L 33/62 |
| 2019/0244567 A1* | 8/2019 | Cho | H05B 45/40 |
| 2019/0245005 A1* | 8/2019 | Kang | H01L 27/15 |
| 2020/0005703 A1* | 1/2020 | Kim | G09G 3/32 |
| 2020/0013929 A1* | 1/2020 | Lee | H01L 33/005 |
| 2020/0043976 A1* | 2/2020 | Kim | H01L 25/0753 |
| 2020/0203587 A1* | 6/2020 | Kim | H01L 27/156 |
| 2020/0273906 A1* | 8/2020 | Li | H01L 27/156 |
| 2021/0272937 A1* | 9/2021 | Lim | H01L 25/0753 |
| 2021/0273131 A1* | 9/2021 | Kang | H01L 24/82 |
| 2021/0273142 A1* | 9/2021 | Kang | H01L 33/62 |
| 2021/0288217 A1* | 9/2021 | Li | H01L 25/167 |
| 2021/0288220 A1* | 9/2021 | Oh | H01L 25/0753 |
| 2022/0093828 A1* | 3/2022 | Kwag | H01L 25/0753 |
| 2023/0025769 A1* | 1/2023 | Kim | H01L 25/0753 |
| 2023/0187474 A1* | 6/2023 | Kim | H01L 27/156 257/72 |

\* cited by examiner

MTL_1: MTL1_1, MTL2_1, MTL3_1

520_1: 521_1, 522_1

DISPLAY DEVICE AND METHOD OF FABRICATING THE SAME

CROSS-REFERENCE TO RELATED APPLICATION

This application is a divisional application of U.S. patent application Ser. No. 16/910,962, filed Jun. 24, 2020, which claims priority to and the benefit of Korean Patent Application No. 10-2019-0105691 filed on Aug. 28, 2019 in the Korean Intellectual Property Office, the entire content of each of which is incorporated herein by reference.

BACKGROUND

1. Field

One or more aspects of embodiments of the present disclosure relate to a display device and a method of fabricating the same. For example, the present disclosure relates to a display device including a plurality of insulating patterns and a method of fabricating the same.

2. Description of the Related Art

With the development of multimedia, display devices are becoming more important. In response to this development, various types of display devices, such as organic light emitting diode (OLED) display devices, liquid crystal display (LCD) devices, and/or the like, are being used.

An example device for displaying an image of a display device includes a display panel such as an OLED panel or an LCD panel. Among the above panels, a light emitting display panel may include a light emitting element. For example, a light emitting diode (LED) may include an OLED using (including) an organic material as a fluorescent material, and/or an inorganic LED using (including) an inorganic material as a fluorescent material.

SUMMARY

One or more embodiments of the present disclosure provide a display device including a plurality of insulating patterns.

One or more embodiments of the present disclosure also provide a method of fabricating a display device so as to form a plurality of contact electrodes using a lift off process in the same process.

It should be noted that objects and embodiments of the present disclosure are not limited to the above-described objects and embodiments, and other objects and embodiments of the present disclosure should be apparent to those skilled in the art from the following descriptions.

According to an example embodiment of the present disclosure, a display device includes a substrate, a first electrode and a second electrode spaced apart from each other on the substrate along a first direction, a first insulating pattern on the substrate to cover at least a portion of each of the first electrode and the second electrode, a light emitting element between the first electrode and the second electrode on the first insulating pattern, a first contact electrode in contact with the first electrode and one end portion of the light emitting element, a second contact electrode in contact with the second electrode and another end portion of the light emitting element, and a second insulating pattern on the light emitting element, at least a portion of the second insulating pattern being in contact with the first contact electrode and the second contact electrode, wherein the second insulating pattern includes a first upper surface not in contact with the first contact electrode or the second contact electrode.

In an embodiment, the light emitting element may extend in one direction, and a width in the first direction of the second insulating pattern may be smaller than a length in the first direction of the light emitting element.

In an embodiment, the width of the second insulating pattern may be smaller than a width in the first direction of the first insulating pattern.

In an embodiment, the second insulating pattern may further include a first lower surface in contact with the light emitting element and a second lower surface in contact with the first insulating pattern.

In an embodiment, the display device may further comprise a third insulating pattern between the light emitting element and the first insulating pattern, wherein the light emitting element may be in contact with the first insulating pattern and the third insulating pattern.

In an embodiment, a width in the first direction of the third insulating pattern may be smaller than that of the second insulating pattern.

In an embodiment, at least a portion of the second lower surface of the second insulating pattern may be in contact with the third insulating pattern.

In an embodiment, the second insulating pattern may include a first contact surface in contact with the first contact electrode and a second contact surface in contact with the second contact electrode, and the first contact surface may be on a first side surface of the second insulating pattern, and the second contact surface may be on a second side surface of the second insulating pattern.

In an embodiment, the first contact surface and the second contact surface may be not parallel to the first upper surface.

In an embodiment, the first contact surface and the second contact surface may be perpendicular to the substrate.

In an embodiment, the first contact electrode may further include a second upper surface connected to the first contact surface, the second contact electrode may further include a third upper surface connected to the second contact surface; and at least one selected from the second upper surface and the third upper surface may be coplanar with the first upper surface.

In an embodiment, at least one selected from the second upper surface and the third upper surface may be spaced apart from a reference surface defined by the first upper surface.

In an embodiment, the first contact electrode may be in contact with a side surface of the one end portion of the light emitting element, and the second contact electrode may be in contact with a side surface of the other end portion of the light emitting element.

According to another embodiment of the present disclosure, a display device comprises a first electrode extending in a first direction, a second electrode extending in the first direction and spaced apart from the first electrode in a second direction crossing the first direction, a light emitting element between the first electrode and the second electrode, a first contact electrode on the first electrode and in contact with one end portion of the light emitting element, a second contact electrode on the second electrode and in contact with the other end portion of the light emitting element, and an insulating pattern on the light emitting element between the first contact electrode and the second contact electrode, the insulating pattern including a first side surface and a second side surface facing the first side surface, wherein the insulating pattern extends in the first direction, the first side surface is in contact with the first contact electrode, and the second side surface is in contact with the second contact electrode.

In an embodiment, a width in the second direction of the insulating pattern may be equal to a width in the second direction of a region between the first contact electrode and the second contact electrode.

In an embodiment, the light emitting element may extend in the second direction, and the width of the insulating pattern may be smaller than a length in the second direction of the light emitting element.

According to another embodiment of the present disclosure, a method of fabricating a display device comprises forming a first electrode and a second electrode on a substrate, forming a light emitting element between the first electrode and the second electrode, forming an insulating layer on the light emitting element, forming a lift off layer on the insulating layer and patterning the insulating layer to form an insulating pattern on the light emitting element, forming a metal layer on the first electrode, the second electrode, and the lift off layer, removing the lift off layer, and forming a first contact electrode in contact with one side surface of the insulating pattern and a second contact electrode in contact with another side surface of the insulating pattern.

In an embodiment, the first contact electrode may be in contact with the first electrode and one end portion of the light emitting element, and the second contact electrode may be in contact with the second electrode and another end portion of the light emitting element.

In an embodiment, an upper surface of the insulating pattern may be not in contact with the first contact electrode or the second contact electrode.

In an embodiment, the forming of the lift off layer may further include forming a hard mask layer between the insulating layer and the lift off layer, and the insulating pattern may include a region in which the one side surface and the other side surface are exposed and are not in contact with the first contact electrode or the second contact electrode.

BRIEF DESCRIPTION OF THE DRAWINGS

The above and other aspects and features of the present disclosure will become more apparent by describing exemplary embodiments thereof in more detail with reference to the attached drawings, in which.

DETAILED DESCRIPTION

The subject matter of the present disclosure will now be described more fully hereinafter with reference to the accompanying drawings, in which example embodiments of the present disclosure are shown. The subject matter of the present disclosure may, however, be embodied in different forms and should not be construed as limited to the embodiments set forth herein. Rather, these embodiments are provided so that this disclosure will be thorough and complete, and will filly convey the scope of the present disclosure to those skilled in the art.

It will also be understood that when a layer is referred to as being "on" another layer or substrate, it can be directly on the other layer or substrate, or intervening layers may also be present. When an element is referred to as being "directly on," there are no intervening elements present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the spirit and scope of the present disclosure. Similarly, the second element could also be termed the first element.

As used herein, expressions such as "at least one of", "one of", and "selected from", when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure."

Hereinafter, embodiments of the present disclosure will be described with reference to the accompanying drawings.

Figure 1:
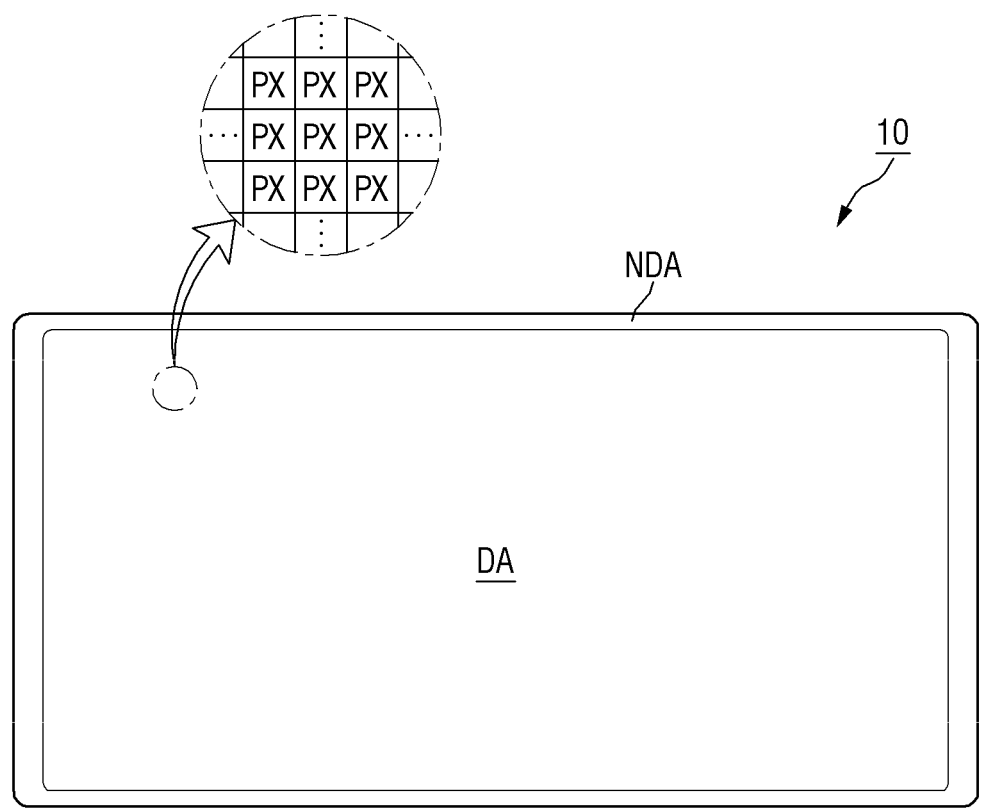
FIG. 1 is a schematic plan view of a display device according to one embodiment.

FIG. 1 is a schematic plan view of a display device according to one embodiment.

Referring to FIG. 1, a display device 10 displays a moving image or a still image. The display device 10 may refer to any suitable electronic device which provides (includes) a display screen. For example, the display device 10 may include televisions, notebooks (laptop computers), monitors, advertising boards, Internet of Things devices, mobile phones, smart phones, tablet personal computers (PCs), electronic clocks, smart watches, watch phones, head mounted displays, mobile communication terminals, electronic notebooks, electronic books, portable multimedia players (PMPs), navigation devices, game machines, digital cameras, camcorders, and/or the like, which provide (include) display screens.

The display device 10 includes a display panel including a display screen. Non-limiting examples of the display panel may include light emitting diode (LED) display panels, organic light emitting display panels, quantum dot light emitting display panels, plasma display panels, field emission display panels, and the like. Hereinafter, a case in which the LED display panel is applied as an example of the display panel is illustrated, but the present disclosure is not limited thereto, and other suitable display panels may be applied as long as substantially the same technical spirit is applicable.

A shape of the display device 10 may be variously suitably modified. For example, the display device 10 may have a rectangular shape having a long width (e.g., where width is larger than each of length and height), a rectangular shape having a long height (e.g., where height is larger than each of length and width), a square shape, a quadrangular shape having rounded corners, shape of other polygons, a circular shape, and/or the like. A shape of a display area DA of the display device 10 may also be substantially similar to the shape of the display device 10. In FIG. 1, the display device 10 and the display area DA, which are both of a rectangular shape having a long width, are illustrated.

The display device 10 may include the display area DA and a non-display area NDA. The display area DA is an area in which a screen (image) may be displayed, and the non-display area NDA is an area in which the screen (image) is not displayed. The display area DA may be referred to as an active area, and the non-display area NDA may be referred to as an inactive area.

The display area DA may approximately occupy a center of the display device 10. The display area DA may include a plurality of pixels PX. The plurality of pixels PX may be arranged in row and column directions. In a plan view, a shape of each pixel PX may be a rectangle or square shape, but the present disclosure is not limited thereto. Each pixel PX may have a rhombic shape in which each side thereof is inclined with respect to one direction. Each pixel PX may include one or more light emitting elements 300, which can emit light in a specific (e.g., set) wavelength range, to display a specific (e.g., set) color.

Figure 2:
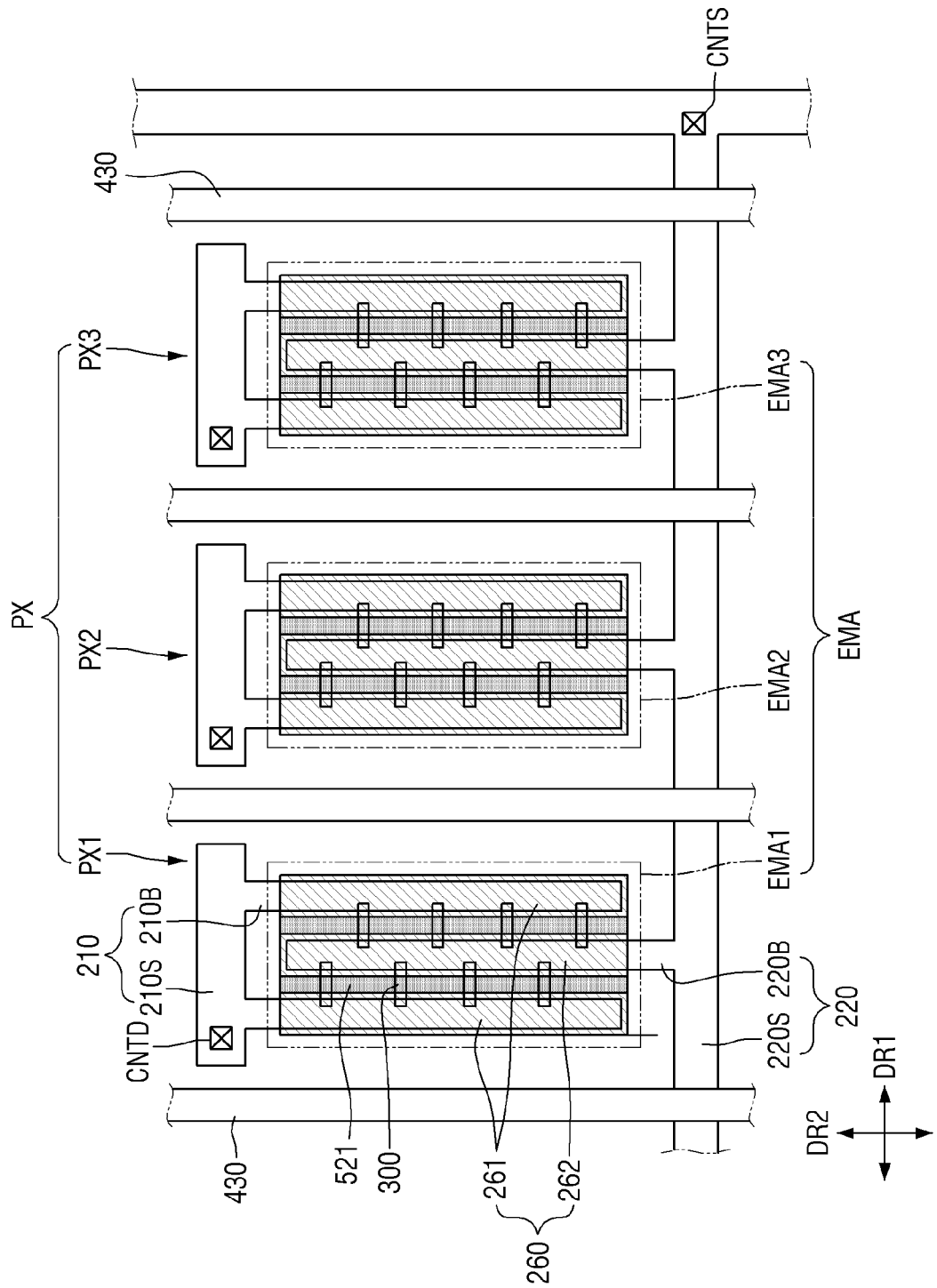
FIG. 2 is a schematic plan view of one pixel of the display device according to one embodiment.
Figure 3:
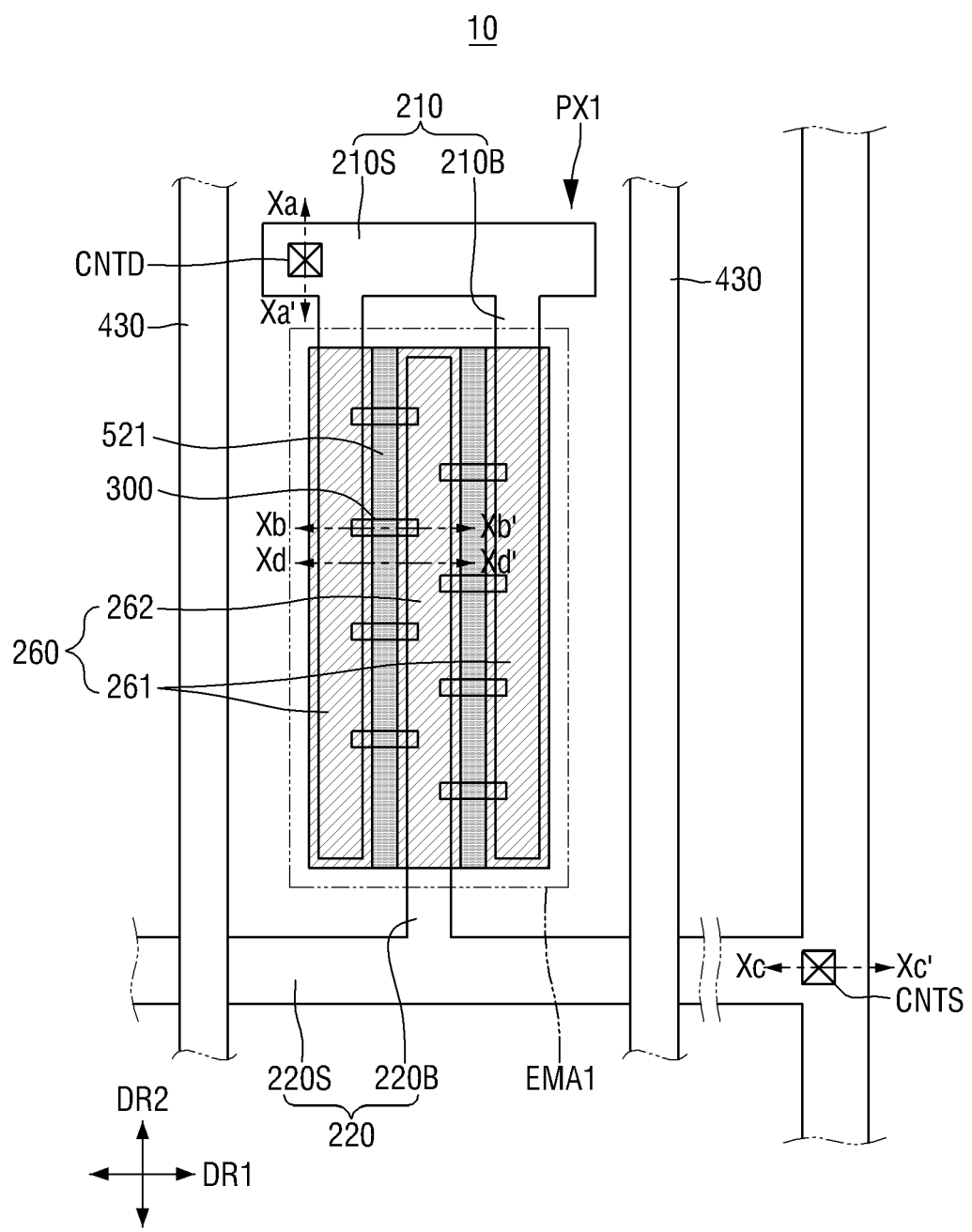
FIG. 3 is a plan view illustrating one sub-pixel of FIG. 2.

FIG. 2 is a schematic plan view of one pixel of the display device according to one embodiment. FIG. 3 is a plan view illustrating one sub-pixel of FIG. 2.

Referring to FIGS. 2 and 3, each of the plurality of pixels PX may include a first sub-pixel PX1, a second sub-pixel PX2, and a third sub-pixel PX3. The first sub-pixel PX1 may emit light having a first color, the second sub-pixel PX2 may emit light having a second color, and the third sub-pixel PX3 may emit light having a third color. The first color may be a blue color, the second color may be a green color, and the third color may be a red color, but the present disclosure is not limited thereto, and each sub-pixel PXn may emit light of the same color. Further, although each pixel PX including three sub-pixels PXn has been illustrated in FIG. 2, the present disclosure is not limited thereto, and each pixel PX may include a greater number of sub-pixels PXn (e.g., more than three sub-pixels PXn).

Each sub-pixel PXn of the display device 10 may include an area defined as a light emission area EMA. The first sub-pixel PX1 may include a first light emission area EMA1, the second sub-pixel PX2 may include a second light emission area EMA2, and the third sub-pixel PX3 may include a third emission area EMA3. The light emission area EMA may be defined as an area in which light emitting element 300 included in the display device 10 is to emit light in a specific (e.g., set) wavelength range. The light emitting element 300 includes an active layer 330, and the active layer 330 may emit light in a specific (e.g., set) wavelength range without any specific orientation. For example, the light emitted from the active layer 330 of the light emitting element 300 may be emitted in a side direction of the light emitting element 300 as well as in both end portion directions thereof. The light emission area EMA of each sub-pixel PXn may include an area in which the light emitting element 300 is present. And, the light emission area EMA may further include an area in which the light from the light emitting element 300 is emitted. However, the present disclosure is not limited thereto, and the light emission area EMA may also include an area in which the light emitted from the light emitting element 300 is reflected and/or refracted due to another member to be emitted. A plurality of light emitting elements 300 may be included in each sub-pixel PXn, and may together form the light emission area EMA including an area in which the light emitting elements 300 are present and an area adjacent thereto.

In one or more embodiments, each sub-pixel PXn of the display device 10 may include a non-light emission area, which may be defined as an area of the sub-pixel PXn except for the light emission area EMA. The non-light emission area may be an area in which the light emitting elements 300 are not present and to which light emitted from the light emitting elements 300 does not reach, so that light is not emitted in the non-light emission area.

Figure 4:
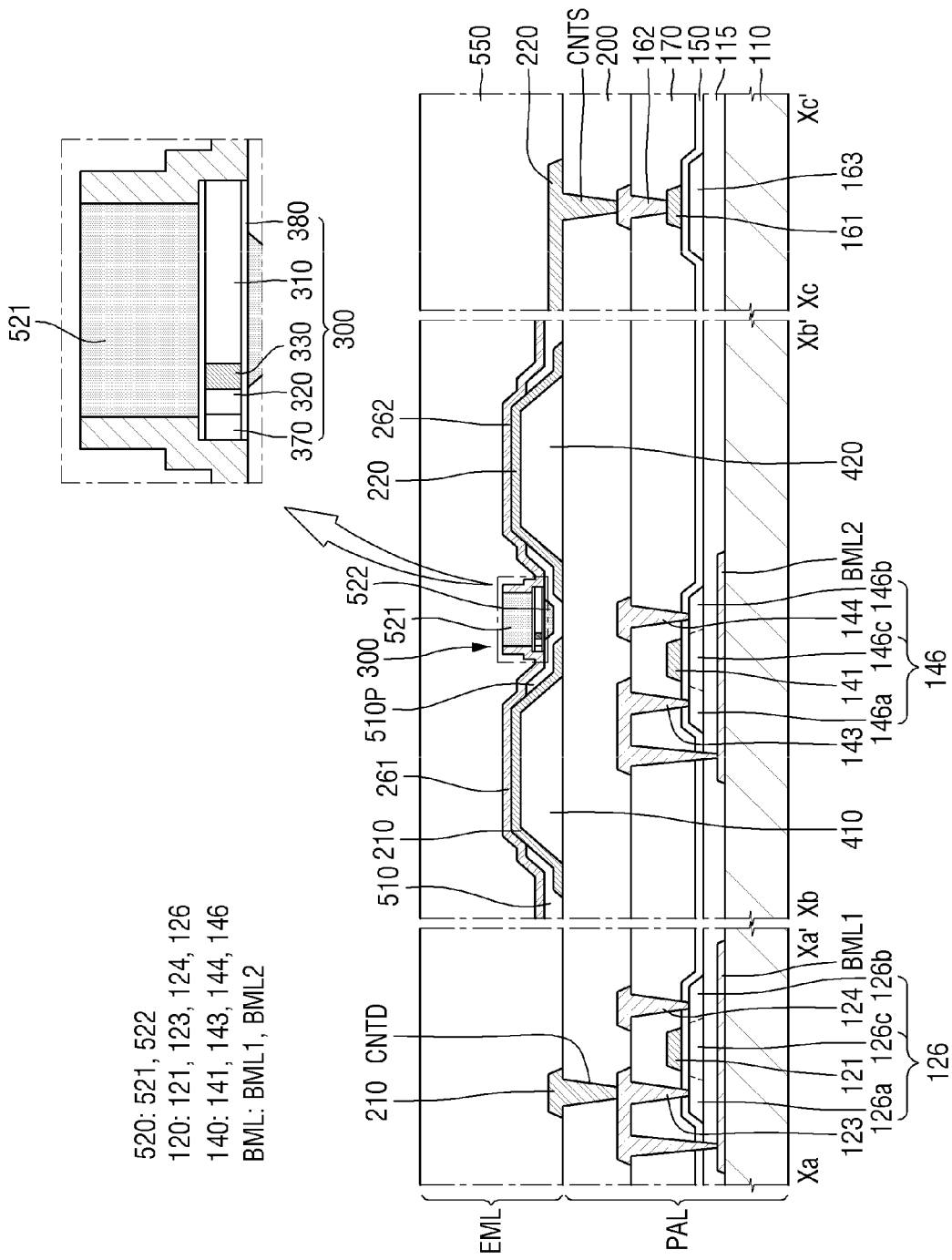
FIG. 4 shows cross-sectional views taken along lines Xa-Xa', Xb-Xb', and Xc-Xc' of FIG. 3.

Each sub-pixel PXn of the display device 10 may include a plurality of electrodes 210 and 220, the light emitting elements 300, a plurality of contact electrodes 260, a plurality of banks 410, 420, and 430 shown in FIG. 4, and one or more insulating layers 510, 520, and 550 (see FIG. 4).

The plurality of electrodes 210 and 220 may be electrically connected to the light emitting elements 300 and may receive a predetermined (or set) voltage so as to allow the light emitting elements 300 to emit light in a specific (e.g., set) wavelength range. Further, at least a portion of each of the electrodes 210 and 220 may be utilized to form an electric field in the sub-pixel PXn to align the light emitting elements 300.

The plurality of electrodes 210 and 220 may include a first electrode 210 and a second electrode 220. In an exemplary embodiment, the first electrode 210 may be a pixel electrode, which is separated with respect to each sub-pixel PXn, and the second electrode 220 may be a common electrode, which is commonly connected along each sub-pixel PXn (e.g., commonly connected across all sub-pixels PXn in one pixel PX). One of the first electrode 210 and the second electrode 220 may be an anode electrode of the light emitting element 300, and the other thereof may be a cathode electrode of the light emitting element 300. However, the present disclosure is not limited thereto.

The first electrode 210 and the second electrode 220 may respectively include electrode stems 210S and 220S extending in a first direction DR1, and one or more electrode branches 210B and 220B extending and branching from the electrode stem 210S and 220S in a second direction DR2 intersecting the first direction DR1.

The first electrode 210 may include a first electrode stem 210S extending in the first direction DR1, and at least one first electrode branch 210B branching from the first electrode stem 210S to extend in the second direction DR2.

Both ends of a first electrode stem 210S of any one pixel may be formed to be spaced apart from each other between the sub-pixels PXn and to be substantially collinear (e.g., substantially aligned) with a first electrode stem 210S of a sub-pixel PXn in the same row (e.g., adjacent thereto in the first direction DR1). Both ends of the first electrode stem 210S in each sub-pixel PXn may be spaced apart from each other so that different electrical signals may be applied to the first electrode branches 210B (if more than one are present), and the first electrode branch 210B may be individually driven.

In one or more embodiments, the first electrode branch 210B branches from at least a portion of the first electrode stem 210S and extends in the second direction DR2. The first electrode branch 210B may be spaced apart from the second electrode stem 220S facing the first electrode stem 210S.

The second electrode 220 may include the second electrode stem 220S, which extends in the first direction DR1 and is spaced apart from the first electrode stem 210S in the second direction DR2 to face the first electrode stem 210S, and a second electrode branch 220B, which branches from the second electrode stem 220S and extends in the second direction DR2. One end portion of the second electrode stem 220S may be connected to a second electrode stem 220S of another sub-pixel PXn adjacent thereto in the first direction DR1. For example, unlike the first electrode stem 210S, the second electrode stem 220S may extend in the first direction DR1 to cross each sub-pixel PXn. The second electrode stem 220S crossing each sub-pixel PXn may be connected to an outer portion of the display area DA, in which each pixel PX or each sub-pixel PXn is positioned, or connected to a portion extending from the non-display area NDA in one direction.

The second electrode branch 220B may be spaced apart from and may face the first electrode branch 210B in the first direction DR1. The second electrode branch 220B may be spaced apart from the first electrode stem 210S in the second direction DR2. The second electrode branch 220B may be connected to the second electrode stem 220S, and an end portion of the second electrode branch 220B in an extension direction thereof (e.g., in the second direction DR2) may be positioned in the sub-pixel PXn and may be spaced apart from the first electrode stem 210S.

The first electrode 210 and the second electrode 220 may each be electrically connected to a circuit element layer PAL (see FIG. 22) of the display device 10 through contact holes, e.g., a first electrode contact hole CNTD and a second electrode contact hole CNTS. In the drawings, the first electrode contact hole CNTD has been illustrated as being formed in the first electrode stem 210S of each sub-pixel PXn, and one second electrode contact hole CNTS has been illustrated as being formed in one second electrode stem 220S crossing each sub-pixel PXn (e.g., the one second electrode contact hole CNTS may be formed in only one sub-pixel PXn). However, the present disclosure is not limited thereto, and in some cases, the second electrode contact hole CNTS may be formed in each sub-pixel PXn.

In the drawings, two first electrode branches 210B have been illustrated as being on each sub-pixel PXn, and one second electrode branch 220B has been illustrated as being between the two first electrode branch 210B, but the present disclosure is not limited thereto. Further, the first electrode 210 and the second electrode 220 do not necessarily have a shape extending in one direction and may have various suitable structures. For example, the first electrode 210 and the second electrode 220 may have a partially curved or bent shape, and one electrode of the first electrode 210 and the second electrode 220 may surround the other electrode thereof. A structure or shape of the first electrode 210 and the second electrode 220 may not be particularly limited as long as at least some regions of the first electrode 210 and the second electrode 220 are spaced apart from and face each other to form a space in which the light emitting element 300 will be placed between the at least some regions thereof.

Further, in some embodiments, the electrode stem 210S and 220S may be respectively omitted from the first electrode 210 and the second electrode 220. The first electrode 210 and the second electrode 220 may have a shape extending in only one direction and may be spaced apart from each other in each sub-pixel PXn. A description thereof will be made herein with reference to another embodiment.

The plurality of banks 410, 420, and 430 may include an outer bank 430 at a boundary between the sub-pixels PXn, and a plurality of inner banks 410 and 420 below the electrode 210 and 220 adjacent to a center of each sub-pixel PXn. In one or more embodiments, a first inner bank 410 and a second inner bank 420 may be respectively below the first electrode branch 210B and the second electrode branch 220B.

The outer bank 430 may be at the boundary between the sub-pixels PXn. End portions of the plurality of first electrode stems 210S may be formed to be spaced apart from each other based on the outer bank 430. The outer bank 430 may extend in the second direction DR2 and may be positioned at the boundary between each two adjacent the sub-pixels PXn along the first direction DR1. However, the present disclosure is not limited thereto, and the outer bank 430 may extend in the first direction DR1 and may be positioned at a boundary between each two adjacent sub-pixels PXn along the second direction DR2. The outer bank 430 may include the same material as each of the inner banks 410 and 420 and may be simultaneously (or concurrently) formed with the inner banks 410 and 420 in a single process.

The light emitting element 300 may be between the first electrode 210 and the second electrode 220. One end portion of the light emitting element 300 may be electrically connected to the first electrode 210, and the other end portion thereof may be electrically connected to the second electrode 220. The light emitting element 300 may be electrically connected to the first electrode 210 and the second electrode 220 through the contact electrodes 260 which will be described below.

A plurality of light emitting elements 300 may be spaced apart from each other and arranged substantially in parallel. A separation distance between the light emitting elements 300 is not particularly limited. In some cases, the plurality of light emitting elements 300 may be adjacent to each other to form a group, and a plurality of other light emitting elements 300 may be grouped in a state of being spaced at regular intervals and may have a nonuniform density but may be oriented in one direction to be arranged. Further, in an embodiment, the light emitting element 300 may have a shape extending in one direction, and a direction in which each electrode, e.g., each of the first electrode branch 210B and the second electrode branch 220B, extends may be substantially perpendicular to (e.g., may cross) a direction in which the light emitting element 300 extends. However, the present disclosure is not limited thereto, and the light emitting element 300 may be obliquely positioned without being perpendicular to the direction in which the first electrode branch 210B and the second electrode branch 220B extend.

The light emitting elements 300 according to one embodiment may include active layers 330 having different materials to emit light in different wavelength ranges to the outside. The display device 10 according to one embodiment may include light emitting elements 300 for emitting light in different wavelength ranges. The display device 10 may include the light emitting elements 300 in each sub-pixel PXn; the light emitting elements 300 may have the same structure and may include active layers 330 for emitting light in different wavelength ranges. The light emitting element 300 of the first sub-pixel PX1 may include an active layer 330 which emits a first light L1 having a first wavelength at a central wavelength range, the light emitting element 300 of the second sub-pixel PX2 may include an active layer 330 which emits s second light L2 having a second wavelength at a central wavelength range, and the light emitting element 300 of the third sub-pixel PX3 may include an active layer 330 which emits s third light L3 having a third wavelength at a central wavelength range.

Thus, the first light L1 may be emitted from the first sub-pixel PX1, the second light L2 may be emitted from the second sub-pixel PX2, and the third light L3 may be emitted from the third sub-pixel PX3. In some embodiments, the first light L1 may be blue light in a central wavelength range of 450 nm to 495 nm, the second light L2 may be green light in a central wavelength range of 495 nm to 570 nm, and the third light L3 may be red light in a central wavelength range of 620 nm to 752 nm.

However, the present disclosure is not limited thereto. The first light L1, the second light L2, and the third light L3 may have colors different from those described above, or may have the same color, but the central wavelength ranges may be different from the above-described ranges. Further, in some cases, the first sub-pixel PX1, the second sub-pixel PX2, and the third sub-pixel PX3 may include the same type (or kind) of light emitting elements 300 to emit light having the substantially same color.

In one or more embodiments, the display device 10 may include the first insulating layer 510 which covers at least portions of the first electrode 210 and the second electrode 220.

The first insulating layer 510 may be in each sub-pixel PXn of the display device 10. The first insulating layer 510 may substantially cover an entirety of each sub-pixel PXn and may extend even to other adjacent sub-pixels PXn. The first insulating layer 510 may cover at least portions of the first electrode 210 and the second electrode 220. In some embodiments, the first insulating layer 510 may expose some portions of the first electrode 210 and the second electrode 220, for example, some portions of the first electrode branch 210B and the second electrode branch 220B.

The plurality of contact electrodes 260 may have a shape extending in one direction. Each of the plurality of contact electrodes 260 may be in contact with the light emitting element 300 and the electrodes 210 and 220, and the light emitting elements 300 may receive an electrical signal from the first electrode 210 and the second electrode 220 through the contact electrodes 260.

The contact electrode 260 may include a first contact electrode 261 and a second contact electrode 262. The first contact electrode 261 and the second contact electrode 262 may be respectively on the first electrode branch 210B and the second electrode branch 220B.

The first contact electrode 261 may be on the first electrode 210 or the first electrode branch 210B, to extend in the second direction DR2, and may be in contact with one end portion of the light emitting element 300. The second contact electrode 262 may be on the second electrode 220 or the second electrode branch 220B, to extend in the second direction DR2, and may be in contact with the other end portion of the light emitting element 300. As described below, the first contact electrode 261 and the second contact electrode 262 may be in contact with the first electrode 210 and the second electrode 220 which are exposed through an opening of the first insulating layer 510. The light emitting element 300 may be electrically connected to the first electrode 210 and the second electrode 220 through the first contact electrode 261 and the second contact electrode 262.

In some embodiments, the first contact electrode 261 and the second contact electrode 262 may each have a larger width, measured in one direction, than the widths of each of the first electrode 210 and the second electrode 220 (or the first electrode branch 210B and the second electrode branch 220B), measured in the one direction. The first contact electrode 261 and the second contact electrode 262 may respectively cover side portions of the first electrode 210 and the second electrode 220 (or the first electrode branch 210B and the second electrode branch 220B). However, the present disclosure is not limited thereto, and in some cases, the first contact electrode 261 and the second contact electrode 262 may respectively cover only one side portion of the first electrode branch 210B and the second electrode branch 220B.

Although two first contact electrodes 261 and one second contact electrode 262 have been illustrated in one sub-pixel PXn in the drawings, the present disclosure is not limited thereto. The number of the first contact electrodes 261 and the second contact electrodes 262 may be varied according to the number of the first electrodes 210 and the second electrodes 220, or the number of the first electrode branch 210B and the second electrode branch 220B, which are included in each sub-pixel PXn.

In one or more embodiments, a second insulating layer 520 (see FIG. 4) is positioned on an outer surface of the light emitting element 300. The second insulating layer 520 may be formed to partially surround the outer surface of the light emitting element 300, and may serve to protect and, simultaneously (or concurrently), fix (affix) the light emitting element 300.

The display device 10 according to one embodiment may include a plurality of insulating patterns 510P, 521, and 522. In addition to the first insulating layer 510 and the second insulating layer 520, the display device 10 may include more insulating layers. Among the insulating layers, the first insulating layer 510 may include a first insulating pattern 510P (see FIG. 4) located between the first electrode 210 and the second electrode 220, and the second insulating layer 520 may include a second insulating pattern 521 on the light emitting element 300. Although only the second insulating pattern 521 of the second insulating layer 520 has been illustrated in FIGS. 2 and 3, the present disclosure is not limited thereto.

The second insulating pattern 521 may extend in the second direction DR2 between the first electrode 210 and the second electrode 220. At least a portion of the second insulating pattern 521 may be on the light emitting element 300, and another portion thereof may be on a via layer 200 (see FIG. 4). Further, the second insulating pattern 521 may be between the first contact electrode 261 and the second contact electrode 262. A process of forming the contact electrodes 261 and 262 in a fabricating method of the display device 10 may be performed by a lift off process. Due to the lift-off process, the contact electrodes 261 and 262 may not be positioned on the second insulating layer 520, e.g., on an upper surface of the second insulating pattern 521, and the second insulating pattern 521 may include a contact surface in contact with the contact electrodes 261 and 262. According to one embodiment, a contact surface on which the second insulating pattern 521 is in contact with the contact electrodes 261 and 262 may not be parallel to the upper surface of the second insulating pattern 521. A more detailed description thereof will be made below with reference to other drawings.

In addition to the first insulating layer 510, the display device 10 may include the circuit element layer PAL below each of the electrodes 210 and 220, the second insulating layer 520 covering at least a portion of each of the electrodes 210 and 220 and the light emitting element 300, and a passivation layer 550 (see FIG. 4). Hereinafter, the structure of the display device 10 will be described in more detail with reference to FIG. 4.

FIG. 4 shows cross-sectional views taken along lines Xa-Xa', Xb-Xb', and Xc-Xc' of FIG. 3.

FIG. 4 shows the cross-sectional views of the first sub-pixel PX1 but may be similarly applied to another pixel PX or sub-pixel PXn. FIG. 4 shows the cross-sectional sectional views from one end portion to the other end portion of the light emitting element 300 in the first sub-pixel PX1.

Referring to FIG. 4, with reference to FIGS. 2 and 3, the display device 10 may include the circuit element layer PAL and a light emitting layer EML. The circuit element layer PAL may include a substrate 110, a buffer layer 115, a light blocking layer BML, and first and second transistors 120 and 140; and the light emitting layer EML may include the plurality of electrodes 210 and 220, the light emitting element 300, and the plurality of insulating layers 510, 520, and 550, which are positioned on the first and second transistors 120 and 140.

The substrate 110 may be an insulating substrate. The substrate 110 may be made of an insulating material such as glass, quartz, a polymer resin, and/or the like. The substrate 110 may be a rigid substrate or a flexible substrate which is bendable, foldable, rollable, and/or the like.

The light blocking layer BML may be on the substrate 110. The light blocking layer BML may include a first light blocking layer BML1 and a second light blocking layer BML2. The first light blocking layer BML1 may be electrically connected to a first drain electrode 123 of the first transistor 120, which will be described below. The second light blocking layer BML2 may be electrically connected to a second drain electrode 143 of the second transistor 140.

The first light blocking layer BML1 and the second light blocking layer BML2 are respectively positioned to overlap a first active material layer 126 of the first transistor 120 and a second active material layer 146 of the second transistor 140. The first and second light blocking layers BML1 and BML2 may include light blocking materials to prevent (or reduce) light from being incident on the first and second active material layers 126 and 146. For example, the first and second light blocking layers BML1 and BML2 may be formed of opaque metal materials which block (or reduce) light transmission. However, the present disclosure is not limited thereto, and in some cases, the light blocking layer BML may be omitted.

The buffer layer 115 may be on the light blocking layer BML and the substrate 110. The buffer layer 115 may cover an entirety of the substrate 110 including the light blocking layer BML. The buffer layer 115 may prevent (or reduce) diffusion of impurity ions and infiltration of water and/or outdoor air, and may perform a surface planarization function. Further, the buffer layer 115 may insulate the light blocking layer BML from the first and second active material layers 126 and 146.

A semiconductor layer may be on the buffer layer 115. The semiconductor layer may include the first active material layer 126 of the first transistor 120, the second active material layer 146 of the second transistor 140, and an auxiliary layer 163. The semiconductor layer may include polycrystalline silicon, single crystalline silicon, an oxide semiconductor, and/or the like.

The first active material layer 126 may include a first doped region 126a, a second doped region 126b, and a first channel region 126c. The first channel region 126c may be between the first doped region 126a and the second doped region 126b. The second active material layer 146 may include a third doped region 146a, a fourth doped region 146b, and a second channel region 146c. The second channel region 146c may be between the third doped region 146a and the fourth doped region 146b. The first active material layer 126 and the second active material layer 146 may each independently include polycrystalline silicon. The polycrystalline silicon may be formed by crystallizing amorphous silicon. Examples of the crystallization method may include a rapid thermal annealing (RTA) method, a solid phase crystallization (SPC) method, an excimer laser annealing (ELA) method, a metal induced crystallization (MILC) method, a sequential lateral solidification (SLS) method, and the like, but the present disclosure is not limited thereto. In some embodiments, the first active material layer 126 and the second active material layer 146 may include single crystalline silicon, low temperature polycrystalline silicon, amorphous silicon, and/or the like. The first doped region 126a, the second doped region 126b, the third doped region 146a, and the fourth doped region 146b may be regions of the first active material layer 126 and the second active material layer 146 that are doped with impurities. However, the present disclosure is not limited thereto.

The first active material layer 126 and the second active material layer 146 are not necessarily limited to the above description. In an embodiment, the first active material layer 126 and the second active material layer 146 may each independently include an oxide semiconductor. In this case, the first doped region 126a and the third doped region 146a may be first conductorized regions (e.g., regions having electrical conductivity or regions in which the electrical conductivity has been increased), and the second doped region 126b and the fourth doped region 146b may be second conductorized regions. When the first active material layer 126 and the second active material layer 146 include an oxide semiconductor, the oxide semiconductor may be an oxide semiconductor containing indium (In). In some embodiments, the oxide semiconductor may include indium-tin oxide (ITO), indium-zinc oxide (IZO), indium-gallium oxide (IGO), indium-zinc-tin oxide (IZTO), indium-gallium-tin oxide (IGTO), indium-gallium-zinc-tin oxide (IGZTO), and/or the like. However, the present disclosure is not limited thereto.

A first gate insulating layer 150 may be on the semiconductor layer. The first gate insulating layer 150 may cover an entirety of the buffer layer 115 including the semiconductor layer. The first gate insulating layer 150 may serve as a gate insulating layer of the first and second transistors 120 and 140.

A first conductive layer may be on the first gate insulating layer 150. On the first gate insulating layer 150, the first conductive layer may include a first gate electrode 121 on the first active material layer 126 of the first transistor 120, a second gate electrode 141 on the second active material layer 146 of the second transistor 140, and a power line 161 on the auxiliary layer 163. The first gate electrode 121 may overlap the first channel region 126c of the first active material layer 126, and the second gate electrode 141 may overlap the second channel region 146c of the second active material layer 146.

An interlayer insulating layer 170 may be on the first conductive layer. The interlayer insulating layer 170 may serve as an insulating layer between the first conductive layer and other layers thereabove. The interlayer insulating layer 170 may include an organic insulating material and may perform a surface planarization function.

A second conductive layer may be on the interlayer insulating layer 170. The second conductive layer includes the first drain electrode 123 and a first source electrode 124 of the first transistor 120, the second drain electrode 143 and a second source electrode 144 of the second transistor 140, and a power electrode 162 on the power line 161.

The first drain electrode 123 and the first source electrode 124 may be respectively in contact with the first doped region 126a and the second doped region 126b of the first active material layer 126 through contact holes passing through the interlayer insulating layer 170 and the first gate insulating layer 150. The second drain electrode 143 and the second source electrode 144 may be respectively in contact with the third doped region 146a and the fourth doped region 146b of the second active material layer 146 through contact holes passing through the interlayer insulating layer 170 and the first gate insulating layer 150. Further, the first drain electrode 123 and the second drain electrode 143 may be electrically connected to the first light blocking layer BML1 and the second light blocking layer BML2 through other contact holes.

The via layer 200 may be on the second conductive layer. The via layer 200 may include an organic insulating material and may perform a surface planarization function.

The plurality of banks 410, 420, and 430, the plurality of electrodes 210 and 220, and the light emitting element 300 may be on the via layer 200.

The plurality of banks 410, 420, and 430 may include inner banks 410 and 420 spaced apart from each other in each sub-pixel PXn, and an outer bank 430 on a boundary of a sub-pixel PXn adjacent thereto.

As described above, the outer bank 430 may extend in the first direction DR1 or the second direction DR2 and may be positioned at a boundary between each two adjacent sub-pixels PXn. For example, the outer bank 430 may divide (define) the boundary of each sub-pixel PXn.

During fabrication of the display device 10, when an ink in which the light emitting elements 300 are distributed is injected using an inkjet printing device, the outer bank 430 may perform a function of preventing (or reducing) the ink from crossing the boundary of the sub-pixel PXn. The outer bank 430 may separate inks in which different light emitting elements 300 are distributed from each other in different sub-pixels PXn so as to prevent (or reduce) the inks from being mixed with each other. However, the present disclosure is not limited thereto.

The plurality of inner banks 410 and 420 may include a first inner bank 410 and a second inner bank 420 which are positioned adjacent to a center of each sub-pixel PXn.

The first inner bank 410 and the second inner bank 420 may be spaced apart from and may face each other. The first electrode 210 may be on the first inner bank 410, and the second electrode 220 may be on the second inner bank 420. Referring to FIGS. 3 and 4, it can be understood that the first electrode branch 210B is on the first inner bank 410, and the second electrode branch 220B is on the second inner bank 420.

The first inner bank 410 and the second inner bank 420 may extend in the second direction DR2 in each sub-pixel PXn. Because the first inner bank 410 and the second inner bank 420 extend in the second direction DR2, the first inner bank 410 and the second inner bank 420 may extend toward a sub-pixel PXn adjacent thereto in the second direction DR2. However, the present disclosure is not limited thereto, and the first inner bank 410 and the second inner bank 420 may be positioned in each sub-pixel PXn to form a pattern. The plurality of banks 410, 420, and 430 may each independently include polyimide (PI), but the present disclosure is not limited thereto.

The first inner bank 410 and the second inner bank 420 may have a structure in which at least portions thereof partially protrude with respect to the via layer 200. The first inner bank 410 and the second inner bank 420 may protrude upward from a surface on which the light emitting element 300 is positioned, and at least portions of the protruding portions may have an inclination. The protruding shapes of the first inner bank 410 and the second inner bank 420 are not particularly limited. Because the inner banks 410 and 420 have inclined side surfaces protruding from the via layer 200, light emitted from the light emitting element 300 may be reflected from the inclined side surfaces of the inner banks 410 and 420. As described below, when the electrodes 210 and 220 on the inner banks 410 and 420 include a material having high reflectance, the light emitted from the light emitting element 300 may be reflected from the electrodes 210 and 220, which are located on the inclined side surfaces of the inner banks 410 and 420, to travel in an upward direction of the via layer 200.

In one or more embodiments, the outer bank 430 may divide adjacent sub-pixels PXn and, simultaneously (or concurrently), may perform a function of preventing (or reducing) an ink from overflowing to adjacent sub-pixels PXn in the inkjet process; whereas, the inner banks 410 and 420 may have a protruding structure in each sub-pixel PXn to serve as a reflective partition wall, which reflects the light emitted from the light emitting element 300 in the upward direction of the via layer 200. However, the present disclosure is not limited thereto.

The plurality of electrodes 210 and 220 may be on the via layer 200 and the inner banks 410 and 420. The electrodes 210 and 220 may respectively include the electrode stem 210S and 220S and the electrode branch 210B and 220B. In FIG. 3, line Xa-Xa' is a line crossing the first electrode stem 210S, line Xb-Xb' is a line crossing the first electrode branch 210B and the second electrode branch 220B, and line Xc-Xc' is a line crossing the second electrode stem 220S. For example, in FIG. 4, the first electrode 210 in area Xa-Xa' is the first electrode stem 210S, the first electrode 210 and the second electrode 220 in area Xb-Xb' are respectively the first electrode branch 210B and the second electrode branch 220B, and the second electrode 220 in area Xc-Xc' is the second electrode stem 220S.

Some areas of the first electrode 210 and the second electrode 220 may be on the via layer 200, and some areas thereof may be on the first inner bank 410 and the second inner bank 420. For example, the widths of the first electrode 210 and the second electrode 220, measured in the first direction DR1, may each be greater than those of the inner banks 410 and 420. Some portions of lower surfaces of the first electrode 210 and the second electrode 220 may be in contact with the via layer 200, and some other portions thereof may be in contact with the inner banks 410 and 420.

Further, the first electrode stem 210S and the second electrode stem 220S may extend in the first direction DR1, and the first inner bank 410 and the second inner bank 420 may extend in the second direction DR2, such that the first electrode stem 210S, the second electrode stem 220S, the first inner bank 410, and the second inner bank 420 may cross the boundary of the sub-pixel PXn. The first electrode stem 210S and the second electrode stem 220S may partially overlap the first inner bank 410 and the second inner bank 420. However, the present disclosure is not limited thereto, and, as shown in the drawings, the first electrode stem 210S and the second electrode stem 220S may not overlap the first inner bank 410 and the second inner bank 420.

The first electrode contact hole CNTD may be formed in the first electrode stem 210S to partially expose the first drain electrode 123 of the first transistor 120 by passing through the via layer 200. The first electrode 210 may be in contact with the first drain electrode 123 through the first electrode contact hole CNTD. The first electrode 210 may be electrically connected to the first drain electrode 123 of the first transistor 120 to receive a predetermined (or set) electrical signal therefrom.

The second electrode contact hole CNTS may be formed in the second electrode stem 220S to partially expose the power electrode 162 by passing through the via layer 200. The second electrode 220 may be in contact with the power electrode 162 through the second electrode contact hole CNTS. The second electrode 220 may be electrically connected to the power electrode 162 to receive a predetermined (or set) electrical signal therefrom.

Some regions of the first electrode 210 and the second electrode 220, e.g., the first electrode branch 210B and the second electrode branch 220B, may be respectively on the first inner bank 410 and the second inner bank 420. The first electrode branch 210B may cover the first inner bank 410, and the second electrode branch 220B may cover the second inner bank 420. The first electrode branch 210B and the second electrode branch 220B may be spaced apart from each other, and the plurality of light emitting elements 300 may be between the first electrode branch 210B and the second electrode branch 220B.

Each of the electrodes 210 and 220 may include a transparent conductive material. For example, each of the electrodes 210 and 220 may include a material such as ITO, IZO, indium-tin-zinc oxide (ITZO), and/or the like, but the present disclosure is not limited thereto. In some embodiments, each of the electrodes 210 and 220 may include a conductive material having high reflectance. For example, each of the electrodes 210 and 220 may include a metal such as silver (Ag), copper (Cu), aluminum (Al), and/or the like, as a material having high reflectance. In this case, light incident on each of the electrodes 210 and 220 may be reflected and emitted in the upward direction of each sub-pixel PXn.

Further, each of the electrodes 210 and 220 may be formed in a structure, in which one or more layers of a transparent conductive material and a metal layer having high reflectance are stacked, or formed of a single layer including the transparent conductive material and the metal layer. In an embodiment, each of the electrodes 210 and 220 may have a stacked structure of ITO/Ag/ITO/IZO or may be an alloy containing Al, nickel (Ni), lanthanum (La), and/or the like. However, the present disclosure is not limited thereto.

The first insulating layer 510 may on the via layer 200, the first electrode 210, and the second electrode 220. The first insulating layer 510 partially cover the first electrode 210 and the second electrode 220. Openings OP1 and OP2 (see FIG. 11) may be formed in the first insulating layer 510, and some portions of the first electrode 210 and the second electrode 220 may be exposed through the openings OP1 and OP2. The openings of the first insulating layer 510 may be located to expose relatively flat upper surfaces of the first electrode 210 and the second electrode 220.

In an embodiment, a step may be formed in the first insulating layer 510 between the first electrode 210 and the second electrode 220 so as to recess an upper surface of the first insulating layer 510. In some embodiments, the first insulating layer 510 may include an inorganic insulating material, and a portion of the upper surface of the first insulating layer 510, which covers the first electrode 210 and the second electrode 220, may be recessed due to a step of a member positioned below the first insulating layer 510. The light emitting element 300 on the first insulating layer 510 between the first electrode 210 and the second electrode 220 may be formed in an empty space between the recessed upper surfaces of the first insulating layer 510. The light emitting element 300 may be partially spaced apart from the upper surface of the first insulating layer 510, and the empty space may be filled with a material for forming the second insulating layer 520, which will be described in more detail below.

However, the present disclosure is not limited thereto. The first insulating layer 510 may form a substantially flat upper surface so as to allow the light emitting element 300 to be positioned on it. The substantially flat upper surface may be formed to extend to the inclined side surfaces of the first electrode 210 and the second electrode 220 in one direction toward the first electrode 210 and the second electrode 220. For example, the first insulating layer 510 may be in a region in which the electrodes 210 and 220 overlap the inclined side surfaces of the first inner bank 410 and the second inner bank 420. The contact electrode 260 may be in contact with the exposed regions of the first electrode 210 and the second electrode 220 and may be in contact with an end portion of the light emitting element 300 on the substantially flat upper surface of the first insulating layer 510.

The first insulating layer 510 may protect the first electrode 210 and the second electrode 220 and, simultaneously (or concurrently), may insulate the first electrode 210 from the second electrode 220. Further, the light emitting element 300 on the first insulating layer 510 may be prevented (or protected) from being damaged by being in direct contact with other members. However, the shape and structure of the first insulating layer 510 is not limited thereto.

The light emitting element 300 may be on the first insulating layer 510 between the electrodes 210 and 220. At least one light emitting element 300 may be on the first insulating layer 510. However, the present disclosure is not limited thereto, and, in some embodiments, at least some of the light emitting elements 300 in each sub-pixel PXn may be in a region other than a region between the electrode branch 210B and 220B. For example, in some embodiments, at least some of the light elements 300 in each sub-pixel PXn are not in the region between the electrode branch 210B and 220B. Further, the light emitting element 300 may be positioned in a region that overlaps the electrodes 210 and 220. The light emitting element 300 may be on end portions of the first electrode branch 210B and the second electrode branch 220B facing each other.

The light emitting element 300 may include a plurality of layers arranged in a direction parallel to the via layer 200 (e.g., along the extension direction of the via layer 200). The light emitting element 300 of the display device 10 according to one embodiment may have a shape extending in one direction, and have a structure in which a plurality of semiconductor layers are sequentially positioned in the one direction. As described in more detail below, in the light emitting element 300, a first semiconductor layer 310, the active layer 330, a second semiconductor layer 320, and an electrode layer 370 may be sequentially positioned in the one direction, and an insulating layer 380 may surround outer surfaces of the first semiconductor layer 310, the active layer 330, the second semiconductor layer 320, and the electrode layer 370. The light emitting element 300 on the display device 10 may be positioned such that the one direction for extension thereof is parallel to the via layer 200 (e.g., to the extension direction of the via layer 200), and the plurality of semiconductor layers included in the light emitting element 300 may be sequentially arranged in a direction parallel to an upper surface of the via layer 200. However, the present disclosure is not limited thereto. In some cases, when the light emitting element 300 has another structure, the plurality of semiconductor layers may be arranged in a direction crossing (e.g., perpendicular) to the via layer 200.

Further, according to one embodiment, since the insulating layer 380 is not formed on end surfaces of the light emitting element 300 in the one direction, and the end surfaces thereof are exposed, the exposed end surfaces may be in contact with the first contact electrode 261 and the second contact electrode 262, which will be described below in more detail. However, the present disclosure is not limited thereto. For example, at least a portion of the insulating layer 380 on the light emitting element 300 may be removed, and thus side surfaces of both end portions of the light emitting element 300 may be partially exposed due to the removal of the insulating layer 380. In forming the second insulating layer 520 covering the outer surface of the light emitting element 300 during the process of fabricating the display device 10, the insulating layer 380 may be partially removed. The exposed side surfaces of the light emitting element 300 may be in contact with the first contact electrode 261 and the second contact electrode 262. However, the present disclosure is not limited thereto.

The second insulating layer 520 may be between the first electrode 210 and the second electrode 220. The second insulating layer 520 may partially surround the outer surface of the light emitting element 300. The second insulating layer 520 may protect the light emitting element 300 and, simultaneously (or concurrently), may perform a function of fixing (affixing) the light emitting element 300 during the process of fabricating the display device 10. Further, in an embodiment, a portion of the material of the second insulating layer 520 may be between a lower surface of the light emitting element 300 and the first insulating layer 510. The second insulating layer 520 may be formed to fill the space between the first insulating layer 510 and the light emitting element 300, which is formed during the process of fabricating the display device 10. However, the present disclosure is not limited thereto.

The display device 10 may include the plurality of insulating patterns. In an embodiment, the first insulating layer 510 may include the first insulating pattern 510P located between the first electrode 210 and the second electrode 220, and the second insulating layer 520 may include the second insulating pattern 521 on the light emitting element 300 and the third insulating pattern 522 between the light emitting element 300 and the first insulating pattern 510P. The first insulating pattern 510P may be located between the openings OP1 and OP2 of the first insulating layer 510 and may be a in a region in which the light emitting element 300 is positioned between the first electrode 210 and the second electrode 220. The second insulating pattern 521 of the second insulating layer 520 may be a portion surrounding the outer surface of the light emitting element 300, and the third insulating pattern 522 of the second insulating layer 520 may be on a portion of the first insulating pattern 510P that is partially recessed to fill the space formed between the light emitting elements 300.

Because the first insulating pattern 510P, the second insulating pattern 521, and the third insulating pattern 522 are between the first electrode 210 and the second electrode 220, each of the first insulating pattern 510P, the second insulating pattern 521, and the third insulating pattern 522 may extend in the second direction DR2. The plurality of insulating patterns 510P, 521, and 522 may be in contact with the light emitting elements 300, the electrodes 210 and 220, and the contact electrodes 261 and 262 to form a plurality of contact surfaces. A more detailed description of the insulating patterns will be made below with reference to other drawings.

The first contact electrode 261 and the second contact electrode 262 are respectively on the electrodes 210 and 220. The second insulating layer 520 may be between the first contact electrode 261 and the second contact electrode 262 and may insulate the first contact electrode 261 from the second contact electrode 262 so as to prevent (or protect) the first contact electrode 261 and the second contact electrode 262 from being in direct contact with each other.

The first contact electrode 261 and the second contact electrode 262 may be in contact with at least one end portion of the light emitting element 300 and may be electrically connected to the first electrode 210 or the second electrode 220 to receive an electrical signal.

The first contact electrode 261 may be in contact with the exposed region of the first electrode 210 on the first inner bank 410, and the second contact electrode 262 may be in contact with the exposed region of the second electrode 220 on the second inner bank 420. The first contact electrode 261 and the second contact electrode 262 may transmit electrical signals, which are transmitted from the electrodes 210 and 220 to the light emitting element 300.

The contact electrode 260 may include a conductive material. For example, the contact electrode 260 may include ITO, IZO, ITZO, Al, and/or the like. However, the present disclosure is not limited thereto.

The passivation layer 550 may be on the contact electrode 260 and the second insulating layer 520. The passivation layer 550 may serve to protect members on the via layer 200 from an external environment.

Each of the first insulating layer 510, the second insulating layer 520, and the passivation layer 550, which are described above, may include an inorganic insulating material and/or an organic insulating material. In an embodiment, the first insulating layer 510, the second insulating layer 520, and the passivation layer 550 may each independently include an inorganic insulating material such as silicon oxide ($SiO_x$), silicon nitride ($SiN_x$), silicon oxynitride ($SiO_xN_y$), aluminum oxide ($Al_2O_3$), aluminum nitride (AlN), and/or the like. Further, the first insulating layer 510, the second insulating layer 520, and the passivation layer 550 may each independently include acrylic resin, epoxy resin, phenol resin, polyamide resin, polyimide resin, unsaturated polyester resin, polyphenylene resin, polyphenylene sulfide resin, benzocyclobutene, cardo resin, siloxane resin, silsesquioxane resin, polymethylmethacrylate, polycarbonate, polymethylmethacrylate-polycarbonate synthetic resin, and/or the like, as an organic insulating material. However, the present disclosure is not limited thereto.

Figure 5:
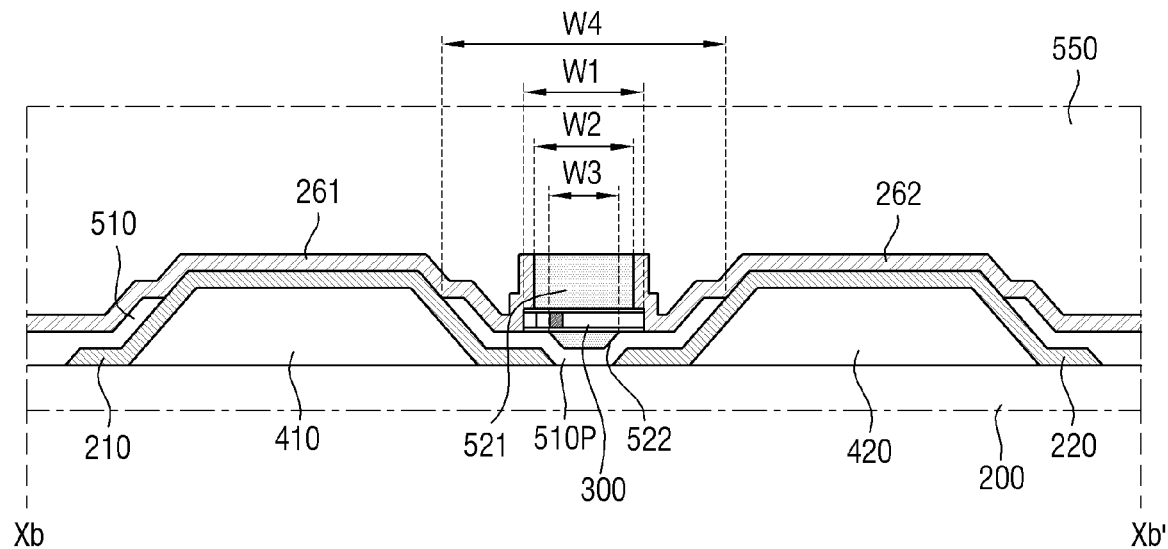
FIG. 5 is a cross-sectional view illustrating a portion of the cross-sectional view of FIG. 4 taken along line Xb-Xb'.
Figure 6:
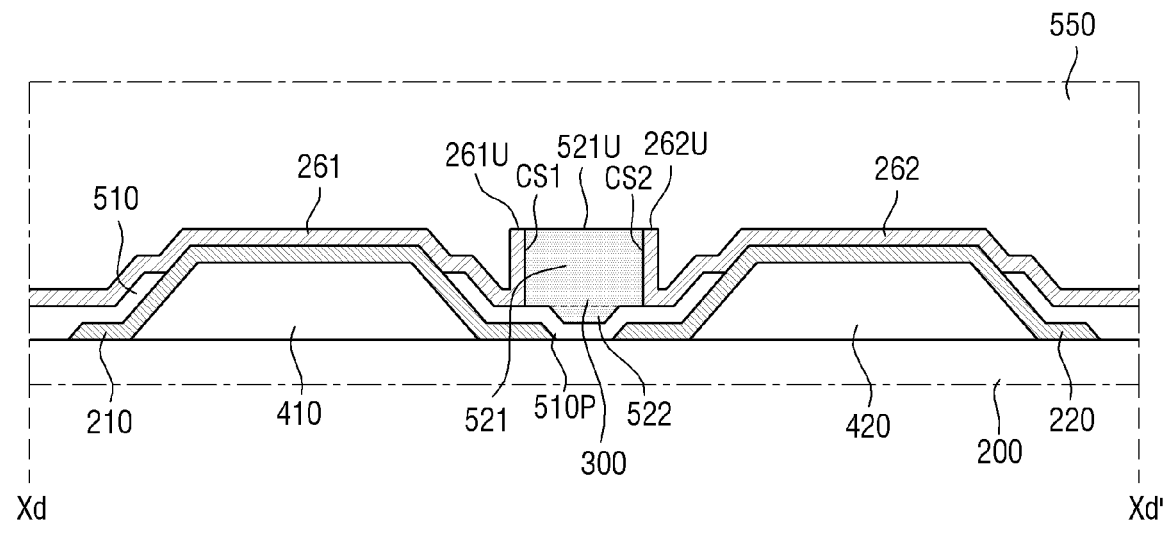
FIG. 6 is a cross-sectional view taken along line Xd-Xd' of FIG. 3.

FIG. 5 is a cross-sectional view illustrating a portion of the cross-sectional view taken along line Xb-Xb' of FIG. 4. FIG. 6 is a cross-sectional view taken along line Xd-Xd' of FIG. 3.

FIG. 5 is a cross section crossing both end portions (e.g., from one end portion to the other) of the light emitting element 300 between the first electrode 210 and the second electrode 220, and FIG. 6 is a cross section crossing a region in which the light emitting element 300 is not located between the first electrode 210 and the second electrode 220.

Referring to FIGS. 5 and 6, the display device 10 may include the plurality of insulating layers 510, 520, and 550, and some of the insulating layers 510, 520, and 550 may include the insulating patterns 510P, 521, and 522. The first insulating layer 510 may include the first insulating pattern 510P, and the second insulating layer 520 may include the second insulating pattern 521 and the third insulating pattern 522.

The first insulating layer 510 includes the first insulating pattern 510P. The first insulating pattern 510P may be between and may partially overlap the first electrode 210 and the second electrode 220. The first insulating pattern 510P may cover portions of the first electrode 210 and the second electrode 220, which are on the via layer 200, and portions of the first electrode 210 and the second electrode 220, which are inclined on the inner banks 410 and 420. Further, the first insulating pattern 510P may be in contact with the via layer 200 in a region in which the first electrode 210 is spaced apart from the second electrode 220. Since the first insulating pattern 510P is in contact with the first electrode 210, the second electrode 220, and the via layer 200, a step may be formed on an upper surface of the first insulating pattern 510P, and a space may be formed between the first insulating pattern 510P and the light emitting element 300 positioned on the upper surface of the first insulating pattern 510P. The third insulating pattern 522 may be positioned in the formed space.

During the process of fabricating the display device 10, the first insulating layer 510 may be placed to cover the first electrode 210 and the second electrode 220 on the via layer 200, and then the openings OP1 and OP2 (see FIG. 11) may be formed so as to expose the first electrode 210 and the second electrode 220. The first insulating pattern 510P is a portion in which the openings OP1 and OP2 are not formed in the first insulating layer 510, and the light emitting element 300 may be on the first insulating pattern 510P. In an embodiment, a width W4, measured in the first direction DR1, of the first insulating pattern 510P may be greater than a length W1, measured in the first direction DR1, of the light emitting element 300. Further, the width W4 of the first insulating pattern 510P may be greater than a gap between the first electrode 210 and the second electrode 220. However, the present disclosure is not limited thereto.

The second insulating layer 520 may include the second insulating pattern 521 and the third insulating pattern 522. The second insulating pattern 521 may be on the light emitting element 300 and may be formed to partially surround the outer surface of the light emitting element 300.

The second insulating pattern 521 may be on a portion of the outer surface of the light emitting element 300, and may perform a function of fixing (affixing) the light emitting element 300. During the process of fabricating the display device 10, the light emitting element 300 between the first electrode 210 and the second electrode 220 may be fixed (affixed) by forming the second insulating layer 520 (or the second insulating pattern 521) thereon.

The third insulating pattern 522 may be between the light emitting element 300 and the first insulating pattern 510P. The third insulating pattern 522 may be formed such that, during the process of fabricating the display device 10, a space between the light emitting element 300 and the first insulating pattern 510P is filled with a material constituting the second insulating layer 520. As described above, a space may be formed between the light emitting element 300 and the first insulating pattern 510P, and the third insulating pattern 522 may be formed in the space. However, the present disclosure is not limited thereto, and in some embodiments, the third insulating pattern 522 may be omitted.

In an embodiment, a portion of a lower surface of the second insulating pattern 521 may be in contact with the light emitting element 300 and another portion thereof may be in contact with the first insulating pattern 510P. The second insulating pattern 521 may include a first lower surface in contact with the light emitting element 300 and a second lower surface in contact with the first insulating pattern 510P. As shown in FIG. 5, in a region in which the light emitting element 300 is positioned, the second insulating pattern 521 may be on the light emitting element 300 to form the first lower surface in contact with the light emitting element 300. Further, as shown in FIG. 6, in a region in which the light emitting element 300 is not positioned, the second insulating pattern 521 may be on the first insulating pattern 510P, and the second lower surface in contact with the first insulating pattern 510P may be formed. Further, the second insulating pattern 521 may also be in partial contact with an upper surface of the third insulating pattern 522. The second insulating pattern 521 may extend in one direction, e.g., the second direction DR2 between the first electrode 210 and the second electrode 220, and may include a region overlapping the light emitting element 300 and a region not overlapping the light emitting element 300. In an embodiment, the first lower surface of the second insulating pattern 521 in the region overlapping the light emitting element 300 may be in contact with the light emitting element 300, and the second lower surface of the second insulating pattern 521 in the region not overlapping the light emitting element 300 may be in contact with the first insulating pattern 510P and the third insulating pattern 522.

The second insulating pattern 521 may be between the first contact electrode 261 and the second contact electrode 262 and may insulate the first contact electrode 261 from the second contact electrode 262. The second insulating pattern 521 may be in contact with the first contact electrode 261 and the second contact electrode 262. The second insulating pattern 521 of the second insulating layer 520 may insulate the first contact electrode 261 from the second contact electrode 262 so as to prevent (or reduce) electrical signals, which are transmitted from the electrodes 210 and 220, from being transmitted through the first contact electrode 261 and the second contact electrode 262.

According to one embodiment, a width W2 of the second insulating pattern 521, measured in the first direction DR1, may be smaller than the length W1 of the light emitting element 300. Further, the width W2 of the second insulating pattern 521 may be smaller than the width W4 of the first insulating pattern 510P. The second insulating pattern 521 may have the width W2 that is smaller than the length W1 of the light emitting element 300 so as to allow both end portions of the light emitting element 300 to be exposed. The first contact electrode 261 and the second contact electrode 262 may be respectively in contact with the both end portions of the light emitting element 300 and may also be in contact with side surfaces of the light emitting element 300, which may be exposed when the second insulating pattern 521 is not present. Thus, an area in which the first contact electrode 261 and the second contact electrode 262 are in contact with the light emitting element 300 may increase, and a material constituting the contact electrode may be prevented (or reduced) from being disconnected.

The third insulating pattern 522 may be in the space between the first insulating pattern 510P and the light emitting element 300, and a width W3, measured in the first direction DR1, of the third insulating pattern 522 may be varied according to the step formed in the first insulating pattern 510P. However, a width of a recessed portion formed in the first insulating pattern 510P, i.e., the width W3 of the third insulating pattern 522, may be smaller than the length W1 of the light emitting element 300 so as to allow the light emitting element 300 to be onto the first insulating pattern 510P. Further, in an embodiment, the width W2 of the second insulating pattern 521 may be greater than the width W3 of the third insulating pattern 522. Because the second insulating pattern 521 has a width that is greater than that of the third insulating pattern 522, the third insulating pattern 522 below the light emitting element 300 may sufficiently fill the recessed portion formed in the first insulating pattern 510P. However, the present disclosure is not limited thereto, and the widths W2 and W3 of the second insulating pattern 521 and the third insulating pattern 522 may be variously modified.

According to one embodiment, the second insulating pattern 521 may include a first upper surface 521U which is not in contact with the first contact electrode 261 or the second contact electrode 262. In the process of fabricating the display device 10, the first contact electrode 261 and the second contact electrode 262 may be formed by a lift off process simultaneously (or concurrently) in one process. Here, a lift off layer PR (see FIG. 13) may be on a second insulator layer 520' (see FIG. 12) forming the second insulating layer 520. A portion of the second insulator layer 520', on which the lift off layer PR is positioned and remains, may form the second insulating pattern 521, and the first contact electrode 261 and the second contact electrode 262 may be in a region in which the lift off layer PR is not present. Because the lift off layer PR is on the first upper surface 521U of the second insulating pattern 521, a material constituting the contact electrode 260 is not formed in that region. Accordingly, the first upper surface 521U of the second insulating pattern 521, which is then exposed by removing the lift off layer PR, may not be in contact with the first contact electrode 261 or the second contact electrode 262.

Further, according to one embodiment, the second insulating pattern 521 may include a first contact surface CS1 in contact with the first contact electrode 261 and a second contact surface CS2 in contact with the second contact electrode 262. The first contact surface CS1 may be on a first side surface of the second insulating pattern 521, and the second contact surface CS2 may be on a second side surface of the second insulating pattern 521. In the second insulating pattern 521, the first upper surface 521U may not be in contact with the contact electrode 260, and only the first side surface and the second side surface may be in contact with the contact electrode 260. The first upper surface 521U of the second insulating pattern 521 may be a surface substantially parallel to the via layer 200, and the first side surface and the second side surface may be surfaces crossing (e.g., perpendicular to) the via layer 200. Thus, according to one embodiment, the first contact surface CS1, which is a surface on which the first contact electrode 261 is in contact with the second insulating pattern 521, and the second contact surface CS2, which is a surface on which the second contact electrode 262 is in contact with the second insulating pattern 521, may not be parallel to the first upper surface 521U of the second insulating pattern 521. The first contact surface CS1 and the second contact surface CS2 may be formed not parallel to the first upper surface 521U of the second insulating pattern 521, may be formed crossing (e.g., perpendicular to) the via layer 200.

Upper surfaces 261U and 262U in contact with the second insulating pattern 521 may be defined in the first contact electrode 261 and the second contact electrode 262. The first contact electrode 261 may include a second upper surface 261U, which is an upper surface of a portion of the first contact electrode 261 connected to the first contact surface CS1, and the second contact electrode 262 may include a third upper surface 262U, which is an upper surface of a portion of the second contact electrode 262 connected to the second contact surface CS2. According to one embodiment, the first upper surface 521U of the second insulating pattern 521 may be coplanar with the second upper surface 261U of the first contact electrode 261 and the third upper surface 262U of the second contact electrode 262. For example, the first upper surface 521U of the second insulating pattern 521 may form the same flat (or substantially flat) surface together with the second upper surface 261U and the third upper surface 262U.

The first contact electrode 261 and the second contact electrode 262 may be formed by the lift off process. A material constituting (for forming) the contact electrode may not be formed on the first upper surface 521U of the second insulating pattern 521 and may be formed on only the side surfaces of the second insulating pattern 521. The first contact electrode 261 and the second contact electrode 262, which are formed after the lift off layer PR is removed, may be formed on only the side surfaces of the second insulating pattern 521, and the second upper surface 261U and the third upper surface 262U may be coplanar with the first upper surface 521U of the second insulating pattern 521. However, the present disclosure is not limited thereto, and in some embodiments, the second upper surface 261U and the third upper surface 262U may form a step with the first upper surface 521U of the second insulating pattern 521. A more detailed description thereof will be made below.

In the display device 10, the lift off process is performed so that the first contact electrode 261 and the second contact electrode 262 may be formed in the same process, and the number of fabricating processes may be reduced. Further, the second insulating pattern 521, which is formed by arranging the lift off layer PR, may be in contact with the contact electrodes 261 and 262 on the side surfaces of the second insulating pattern 521. Because of the width W2 of the second insulating pattern 521 (which is smaller than the length W1 of the light emitting element 300), a contact area between the light emitting element 300 and the contact electrodes 261 and 262 may increase and disconnection of the material forming the contact electrodes 261 and 262 may be prevented or reduced.

Figure 7:
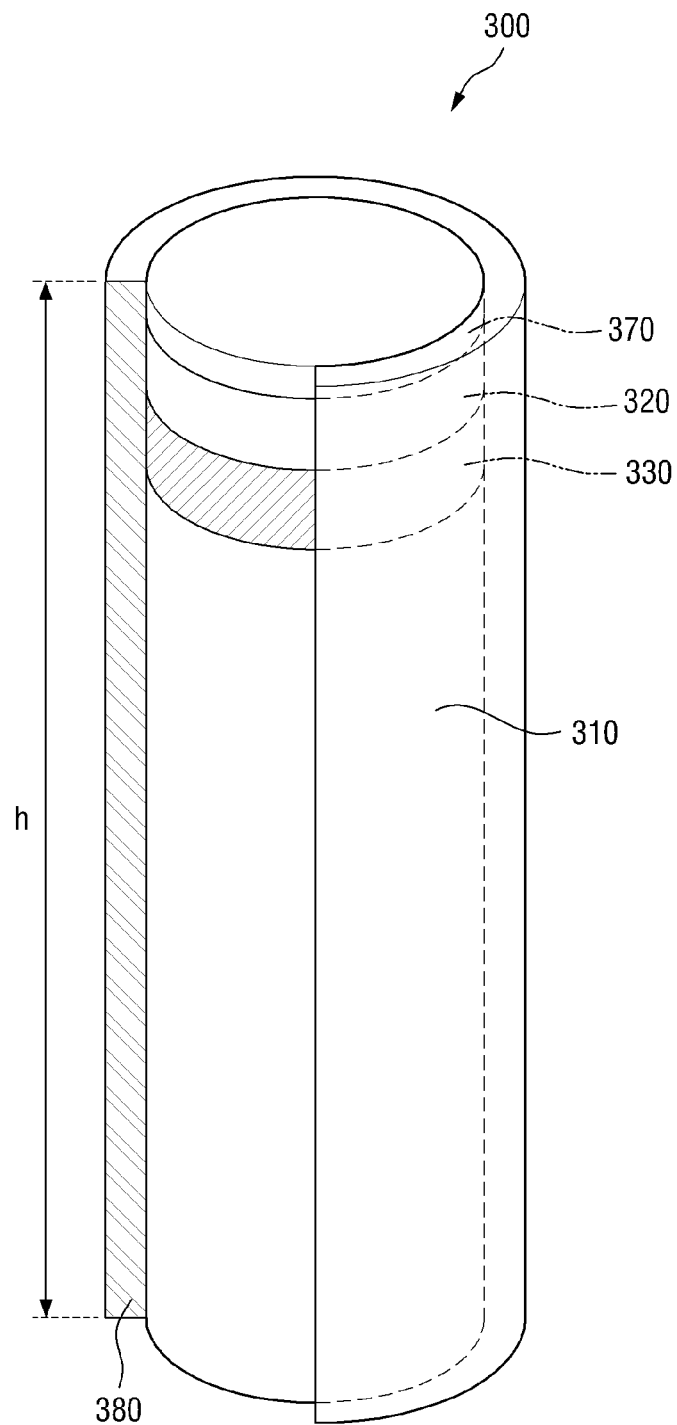
FIG. 7 is a schematic view of a light emitting element according to one embodiment.

FIG. 7 is a schematic view of a light emitting element according to one embodiment.

The light emitting element 300 may be an LED. For example, the light emitting element 300 may be an inorganic LED having a size of a micrometer unit or a nanometer unit and made of an inorganic material. Inorganic LEDs may be arranged between two electrodes in which polarity is formed by forming an electric field in a specific (e.g., set) direction between the two electrodes facing each other. The light emitting elements 300 may be arranged between two electrodes due to an electric field formed on the two electrodes.

The light emitting element 300 according to one embodiment may have a shape extending in one direction. The light emitting element 300 may have a shape of a rod, a wire, a tube, and/or the like. In an embodiment, the light emitting element 300 may be a cylindrical shape or a rod shape. However, the shape of the light emitting element 300 is not limited thereto, and the light emitting element 300 may have a shape of a cube, a rectangular parallelepiped, a polygonal pillar (such as a hexagonal pillar and/or the like), or may have a shape which extends in one direction and has a partially inclined outer surface. Thus, the light emitting element 300 may have various suitable shapes. A plurality of semiconductors included in the light emitting element 300, which will be described in more detail below, may have a structure in which the semiconductors are sequentially arranged or stacked in the one direction.

The light emitting element 300 may include a semiconductor layer doped with a conductive-type (e.g., p-type or n-type) impurity. The semiconductor layer may receive an electric signal applied from an external power source and may emit light in a specific (e.g., set) wavelength range.

The light emitting element 300 according to one embodiment may emit light in a specific (e.g., set) wavelength range. In an embodiment, the active layer 330 may emit blue light in a central wavelength range of 450 nm to 495 nm. However, the central wavelength range of the blue light is not limited to the above-described range, and it should be understood that the central wavelength range includes any wavelength range that can be recognized as a blue color in the art. Further, the light emitted from the active layer 330 of the light emitting element 300 is not limited thereto, and the light may be green light in a central wavelength range of 495 nm to 570 nm or red light in a central wavelength range of 620 nm to 750 nm. Hereinafter, an example in which the light emitting element 300 emits blue light will be described.

Referring to FIG. 7, the light emitting element 300 may include the first semiconductor layer 310, the second semiconductor layer 320, the active layer 330, the electrode layer 370, and the insulating layer 380.

For example, the first semiconductor layer 310 may be an n-type semiconductor having a first conductive type. For example, when the light emitting element 300 emits light in a blue wavelength range, the first semiconductor layer 310 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be one or more selected among AlGaInN, GaN, AlGaN, InGaN, AlN, and InN, which are doped with an n-type impurity. The first semiconductor layer 310 may be doped with a first conductive type dopant. For example, the first conductive type dopant may be Si, Ge, Sn, and/or the like. In an embodiment, the first semiconductor layer 310 may be n-GaN doped with n-type Si. A length of the first semiconductor layer 310 may range from 1.5 μm to 5 μm, but the present disclosure is not limited thereto.

The second semiconductor layer 320 may be on the active layer 330 which will be described in more detail below. For example, the second semiconductor layer 320 may be a p-type semiconductor having a second conductive type. For example, when the light emitting element 300 emits light in a blue or green wavelength range, the second semiconductor layer 320 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be one or more selected among AlGaInN, GaN, AlGaN, InGaN, AlN, and InN, which are doped with an p-type impurity. The second semiconductor layer 320 may be doped with a second conductive type dopant. For example, the second conductive type dopant may be Mg, Zn, Ca, Se, Ba, and/or the like. In an embodiment, the second semiconductor layer 320 may be p-GaN doped with p-type Mg. A length of the second semiconductor layer 320 may range from 0.05 μm to 0.10 μm, but the present disclosure is not limited thereto.

Although the first semiconductor layer 310 and the second semiconductor layer 320 have been illustrated as being formed of one layer, the present disclosure is not limited thereto. According to some embodiments, the first semiconductor layer 310 and the second semiconductor layer 320 may further include additional layers, e.g., a clad layer and/or a tensile strain barrier reducing (TSBR) layer, according to a material of the active layer 330. A more detailed description thereof will be made below with reference to other drawings.

The active layer 330 may be between the first semiconductor layer 310 and the second semiconductor layer 320. The active layer 330 may include a material having a single or multiple quantum well structure. When the active layer 330 includes a material having a multiple quantum well structure, the active layer 330 may have a structure in which a quantum layer and a well layer are alternately stacked. The active layer 330 may emit light due to a combination of electron-hole pairs in response to electrical signals applied through the first semiconductor layer 310 and the second semiconductor layer 320. For example, when the active layer 330 emits light in a blue wavelength range, the active layer 330 may include a material such as AlGaN, AlGaInN, and/or the like. For example, when the active layer 330 has a multi-quantum well structure in which a quantum layer and a well layer are alternately stacked, the quantum layer may include a material such as AlGaN and/or AlGaInN, and the well layer may include a material such as GaN and/or AlInN. In an embodiment, the active layer 330 includes AlGaInN as a quantum layer and AlInN as a well layer. As described above, the active layer 330 may emit blue light in a central wavelength range of 450 nm to 495 nm.

However, the present disclosure is not limited thereto, and the active layer 330 may have a structure in which a semiconductor material having a large band gap energy and a semiconductor material having a small band gap energy are alternately stacked, or may include different group III and/or group V semiconductor materials according to emitted light in a wavelength range. The active layer 330 is not limited to emit light in the blue wavelength range, and in some cases, the active layer 330 may emit light in a red or green wavelength range. A length of the active layer 330 may range from 0.05 μm to 0.10 μm, but the present disclosure is not limited thereto.

The light emitted from the active layer 330 may be emitted to not only an outer surface of the light emitting element 300 in the length direction, but also the both side surfaces of the light emitting element 300. Directivity of the light emitted from the active layer 330 is not limited in one direction.

The electrode layer 370 may be an ohmic contact electrode. However, the present disclosure is not limited thereto, and the electrode layer 370 may be a Schottky contact electrode. The light emitting element 300 may include at least one electrode layer 370. Although the light emitting element 300 has been illustrated as including a single electrode layer 370 in FIG. 7, the present disclosure is not limited thereto. In some cases, the light emitting element 300 may include more electrode layers 370 or the electrode layer 370 may be omitted. The description of the light emitting element 300 provided herein may be applied even when the number of electrode layers 370 is varied or another structure is further included.

In the display device 10 according to one embodiment, when the light emitting element 300 is electrically connected to the electrode or the contact electrode, the electrode layer 370 may reduce resistance between the light emitting element 300 and the electrode, or between the light emitting element 300 and the contact electrode. The electrode layer 370 may include a conductive metal. For example, electrode layer 370 may include at least one selected among Al, titanium (Ti), In, gold (Au), Ag, ITO, IZO, and ITZO. Further, the electrode layer 370 may include a semiconductor material doped with an n-type or p-type impurity. The electrode layer 370 may include the same material or different materials, but the present disclosure is not limited thereto.

The insulating layer 380 may surround the outer surfaces of the plurality of semiconductor layers and the electrode layers described above. In an embodiment, the insulating layer 380 may surround at least the outer surface of the active layer 330 and may extend in one direction in which the light emitting element 300 extends. The insulating layer 380 may serve to protect the members of the light emitting element 300. For example, the insulating layer 380 may be formed to surround side surfaces of the members and to expose the both end portions of the light emitting element 300 in the length direction thereof.

In the drawings, the insulating layer 380 has been illustrated as being formed to extend in the length direction of the light emitting element 300 to cover from the first semiconductor layer 310 to the side surface of the electrode layer 370, but the present disclosure in not limited thereto. When the insulating layer 380 covers only the outer surfaces of some semiconductor layers, including the active layer 330, or covers only a portion of the outer surface of the electrode layer 370, the outer surface of the electrode layer 370 may be partially exposed. In addition, an upper surface of the insulating layer 380 may be formed to be rounded in cross section in a region adjacent to at least one end portion of the light emitting element 300.

A thickness of the insulating layer 380 may range from 10 nm to 1.0 μm, but the present disclosure is not limited thereto. In some embodiments, the thickness of the insulating layer 380 may be about 40 nm.

The insulating layer 380 may include an insulating material such as $SiO_x$, $SiN_x$, $SiO_xN_y$, AlN, $Al_2O_3$, and/or the like. Accordingly, it may be possible to prevent (or reduce the risk of) an electrical short circuit which may occur when the active layer 330 is in direct contact with an electrode through which an electrical signal is transmitted to the light emitting element 300. Further, because the insulating layer 380 protects the outer surface of the light emitting element 300 including the active layer 330, it may be possible to prevent (or reduce the risk of) degradation in light emission efficiency.

Further, in some embodiments, the outer surface of the insulating layer 380 may be surface-treated. In the fabrication of the display device 10, the light emitting elements 300 may be arranged by being injected onto the electrodes in a state of being distributed in a predetermined (or set) ink. Here, in order to allow the light emitting element 300 to maintain the distributed state without being agglomerated with another light emitting element 300 adjacent thereto in the ink, the insulating layer 380 may be hydrophobically or hydrophilically treated.

The light emitting element 300 may have a length h ranging from 1 μm to 10 μm, or from 2 μm to 6 μm, and for example from 3 μm to 5 μm. Further, a diameter of the light emitting element 300 may range from 300 nm to 700 nm, and an aspect ratio of the light emitting element 300 may range from 1.2 to 100. However, the present disclosure is not limited thereto, and the plurality of light emitting elements 300 included in the display device 10 may have different diameters according to a composition difference between the active layers 330. In some embodiments, the diameter of the light emitting element 300 may be about 500 nm.

Hereinafter, a method of fabricating the display device 10 will be described with reference to other drawings.

Figure 8:
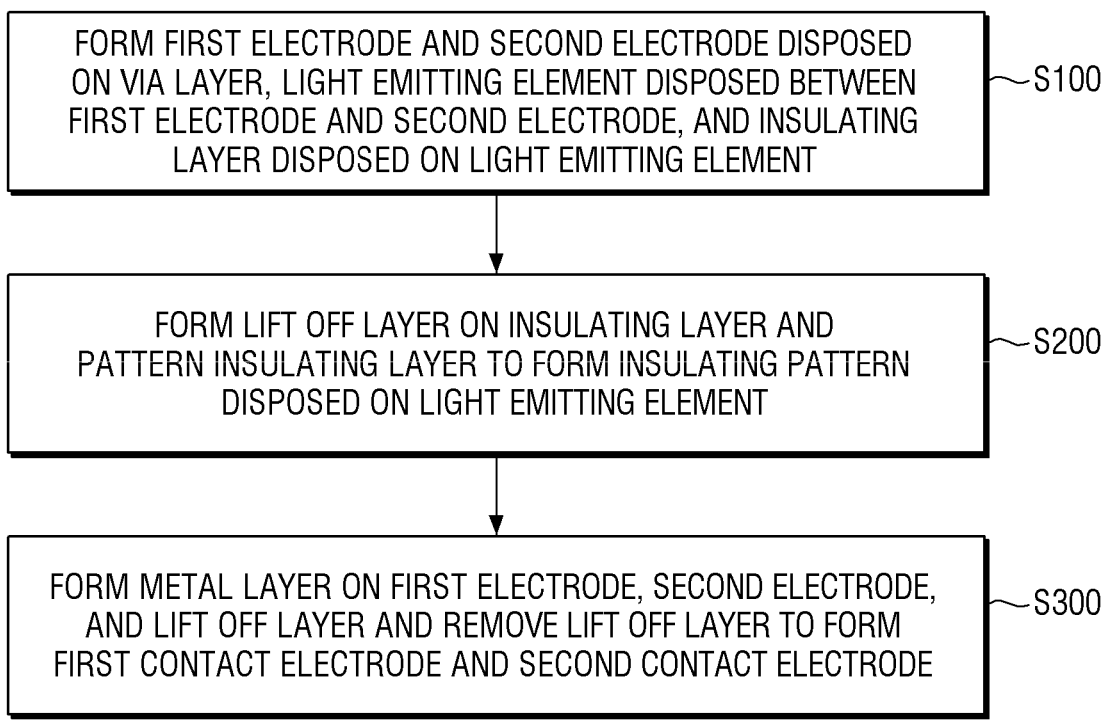
FIG. 8 is a flowchart illustrating a method of fabricating a display device according to one embodiment.

FIG. 8 is a flowchart illustrating a method of fabricating a display device according to one embodiment.

Referring to FIG. 8, a method of fabricating the display device 10 according to one embodiment may include forming the first electrode 210 and the second electrode 220 on the via layer 200, forming the light emitting element 300 between the first electrode 210 and the second electrode 220, and forming an insulating layer on the light emitting element 300 (S100); forming the lift off layer PR on the insulating layer and patterning the insulating layer to form an insulating pattern on the light emitting element 300 (S200); and forming a metal layer MTL on the first electrode 210, the second electrode 220, and the lift off layer PR, and removing the lift off layer PR to form the first contact electrode 261 in contact with one side surface of the insulating pattern and the second contact electrode 262 in contact with the other side surface of the insulating pattern (S300).

The process of fabricating the display device 10 may include a lift-off process of forming the first contact electrode 261 and the second contact electrode 262. The first contact electrode 261 and the second contact electrode 262 formed through the lift-off process may be simultaneously (or concurrently) formed in one process and may be coplanar with the upper surface of the second insulating pattern 521, with which the first contact electrode 261 and the second contact electrode 262 are in contact.

Hereinafter, the process of fabricating the display device 10 will be described in more detail with reference to other drawings.

FIGS. 9 to 18 are cross-sectional views illustrating the process of fabricating a display device according to one embodiment.

Figure 9:
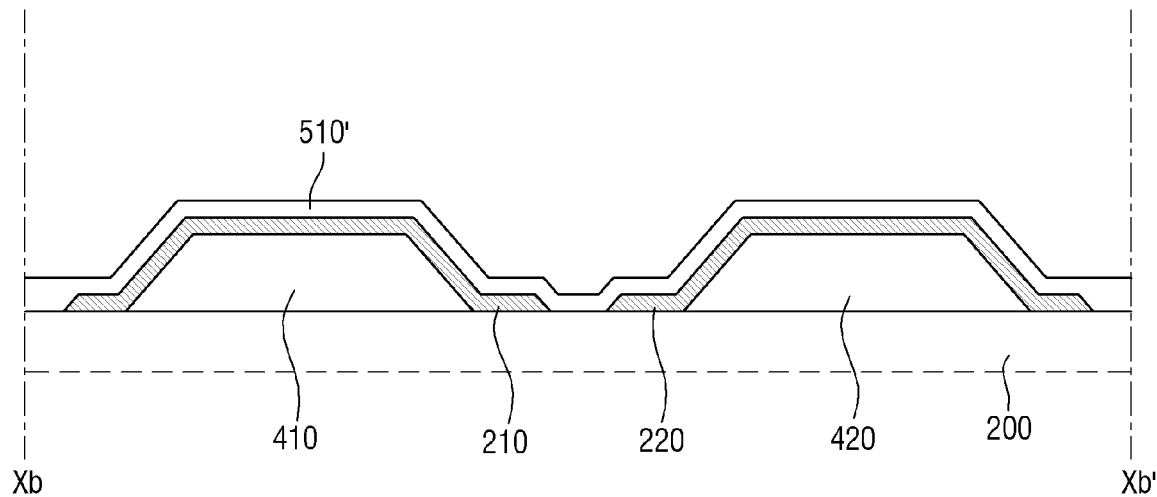
FIGS. 9-18 are cross-sectional views illustrating a process of fabricating a display device according to one embodiment.

Referring to FIG. 9 first, the first inner bank 410, the second inner bank 420, the first electrode 210, and the second electrode 220 are formed on the via layer 200, and a first insulator layer 510' is formed to cover the first inner bank 410, the second inner bank 420, the first electrode 210, and the second electrode 220. Because the structures of the first inner bank 410, the second inner bank 420, the first electrode 210, and the second electrode 220, which are formed on the via layer 200, are the same as those described above with reference to FIG. 4, a detailed description thereof will not be repeated here.

Unlike the first insulating layer 510, the first insulator layer 510' may cover entireties of the members on the via layer 200. The openings OP1 and OP2 exposing some portion of the first electrode 210 and the second electrode 220, respectively, may be formed in the first insulator layer 510' in an operation to form the first insulating layer 510.

Figure 10:
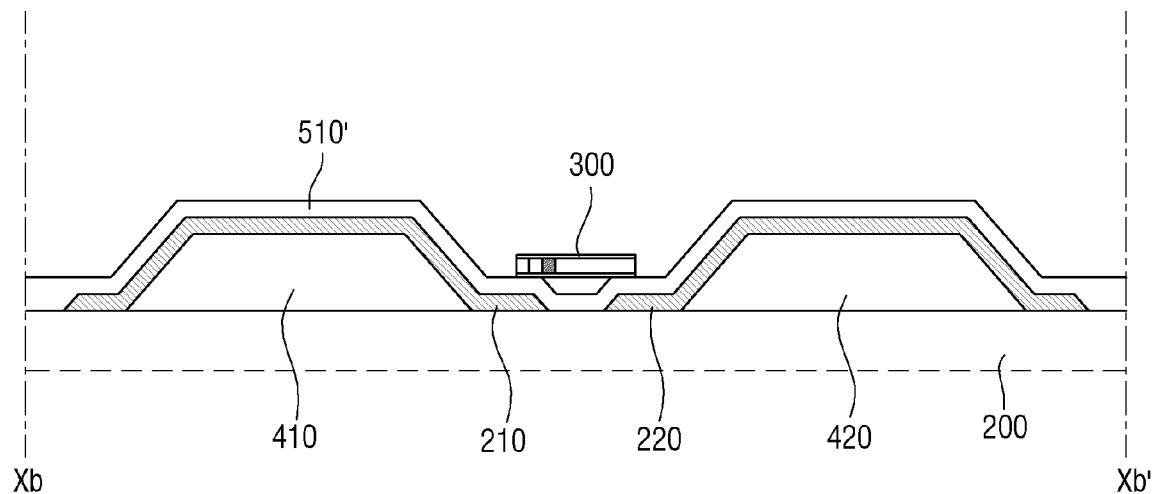

Next, referring to FIG. 10, the light emitting element 300 is positioned between the first electrode 210 and the second electrode 220 on the first insulator layer 510'. A method of arranging the light emitting elements 300 includes injecting a solution containing the light emitting elements 300 onto the electrodes 210 and 220 and applying an electrical signal to each of the electrodes 210 and 220 to form an electric field on the electrodes 210 and 220. The electric field may transmit a dielectrophoretic force to the light emitting elements 300 distributed in the solution, and the light emitting elements 300 may be arranged between the first electrode 210 and the second electrode 220 on the first insulator layer 510' due to the dielectrophoretic force. The light electrodes 210 and 220, and the light emitting elements have already been described herein above, and therefore, a duplicative description thereof will not be repeated here.

Figure 11:
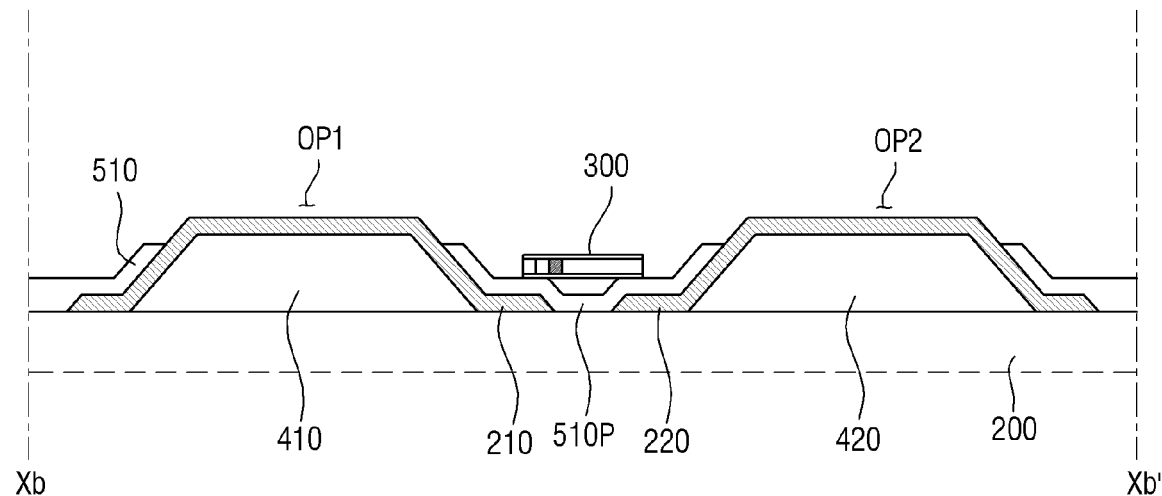

Next, referring to FIG. 11, a portion of the first insulator layer 510' is patterned to form the openings OP1 and OP2 partially exposing the first electrode 210 and the second electrode 220, respectively. The openings OP1 and OP2 may include a first opening OP1 exposing the first electrode 210 and a second opening OP2 exposing the second electrode 220. The first opening OP1 and the second opening OP2 may expose regions of the electrodes 210 and 220 located on the inner banks 410 and 420, respectively. The openings OP1 and OP2 are formed in the first insulator layer 510' so that the first insulating layer 510 including the first insulating pattern 510P may be formed. A description of the first insulating layer 510 is the same as described above.

Figure 12:
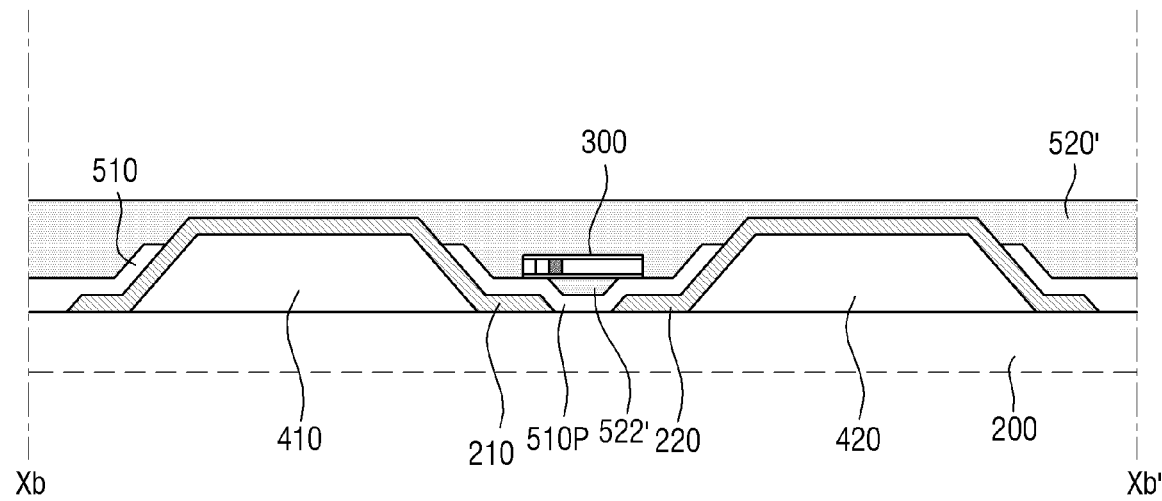

Next, referring to FIG. 12, the second insulator layer 520' is formed to cover the first insulating layer 510, the exposed first electrode 210 and the second electrode 220, and the light emitting element 300. The second insulator layer 520' may be patterned in a subsequent process to form the second insulating layer 520. In an embodiment, the second insulator layer 520' may include an organic insulating material. The second insulator layer 520' may be formed to surround at least the outer surface of the light emitting element 300 and may fill in a space 522' (in FIG. 12), which is formed between the light emitting element 300 and the first insulating pattern 510P. The second insulator layer 520' filling the space 522' may constitute the third insulating pattern 522 of the second insulating layer 520.

Figure 13:
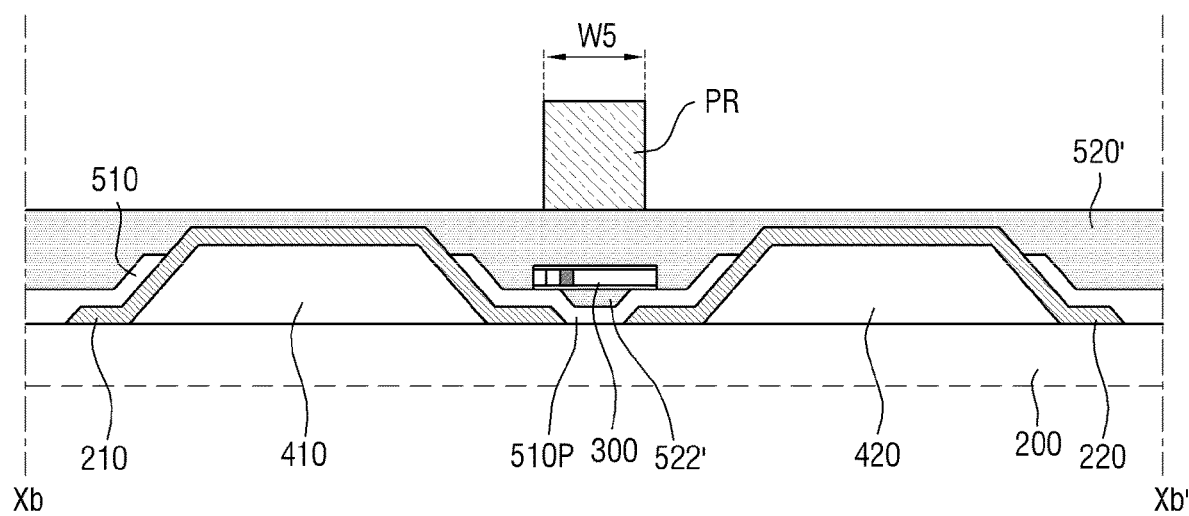
Figure 14:
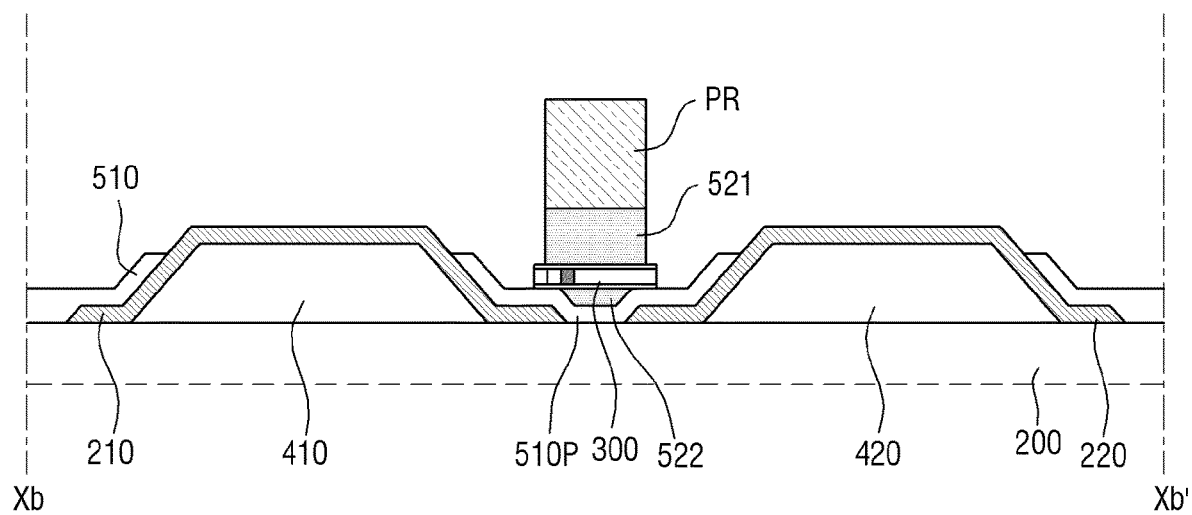

Next, referring to FIGS. 13 and 14, the lift off layer PR is formed on the second insulator layer 520', and the second insulator layer 520' is patterned along the lift off layer PR to form the second insulating layer 520. A type (or kind) of the lift off layer PR is not particularly limited as long as it can serve as a mask in the patterning process. The lift off layer PR may be a photoresist. A process of patterning the second insulator layer 520' may be a suitable etching process. For example, the second insulator layer 520' may be patterned through a dry etching process. However, the present disclosure is not limited thereto.

The lift off layer PR may be in a region overlapping the light emitting element 300 on the second insulator layer 520'. A region of the second insulator layer 520', in which the lift off layer PR is positioned, may remain without being removed in a subsequent process so that the second insulating pattern 521 may be formed. In some embodiments, a width W5, measured in the first direction DR1, of the lift off layer PR may be smaller than a length of the light emitting element 300, and may be substantially the same as the width of the second insulating pattern 521. As shown in FIG. 14, when the second insulator layer 520' is patterned along the lift off layer PR, a region in which the lift off layer PR is placed may form the second insulating pattern 521, and the second insulator layer 520' located below the light emitting element 300 may form the third insulating pattern 522. In order to allow the second insulating pattern 521 to have a width that is smaller than the length of the light emitting element 300, the width W5 of the lift off layer PR may be smaller than the length of the light emitting element 300. However, the present disclosure is not limited thereto.

When the second insulator layer 520' is patterned along the lift off layer PR, both end portions of the light emitting element 300 may be exposed. Here, the width of the second insulating pattern 521 may be controlled and, additionally, the extent to which side surfaces of both end portions of the light emitting element 300 are exposed may be controlled by adjusting the width W5 of the lift off layer PR. When the width W5 of the lift off layer PR is greater than the length of the light emitting element 300, both end portions of the light emitting element 300 may not be sufficiently exposed. In this case, both end portions of the light emitting element 300 may not be in smooth contact with the contact electrodes 261 and 262, which are formed in a subsequent process. In order to prevent (or reduce) this issue, the width W5 of the lift off layer PR may be adjusted to have a range below a predetermined (or set) level. For example, the second insulator layer 520' may be patterned to expose the side surfaces of both end portions of the light emitting element 300 such that a contact area between the light emitting element 300 and the contact electrodes 261 and 262 may increase.

Figure 15:
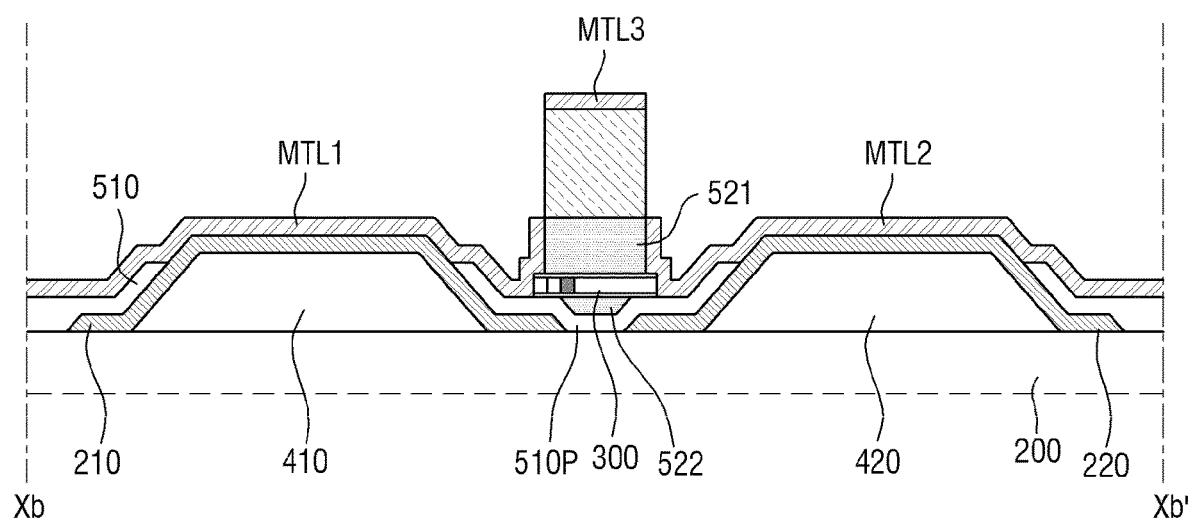

Next, referring to FIG. 15, the metal layer MTL is formed on the first electrode 210, the second electrode 220, the lift off layer PR, and the first insulating layer 510. The process of forming the metal layer MTL may be performed through one or more suitable processes such as a sputtering process, an atomic layer deposition (ALD) process, and/or the like. The metal layer MTL may form the contact electrodes 261 and 262 in a subsequent process. For example, the metal layer MTL may include the same material as the contact electrodes 261 and 262.

The metal layer MTL may be formed on an entirety of the via layer 200. In addition to the first insulating pattern 510P, the metal layer MTL may be in contact with the first insulating layer 510, the exposed first electrode 210, the exposed second electrode 220, and the light emitting element 300. The metal layer MTL may include a first metal layer MTL1 on the first electrode 210 and in contact with one end portion of the light emitting element 300, a second metal layer MTL2 on the second electrode 220 and in contact with the other end portion of the light emitting element 300, and a third metal layer MTL3 on the lift off layer PR.

In a subsequent process, the third metal layer MTL3 may be removed together with the lift off layer PR, and the first metal layer MTL1 and the second metal layer MTL2 may respectively form the first contact electrode 261 and the second contact electrode 262. The first metal layer MTL1 may be in contact with, including one end portion of the light emitting element 300, the first side surface of the second insulating pattern 521, and the second metal layer MTL2 may be in contact with, including the other end portion of the light emitting element 300, the second side surface of the second insulating pattern 521.

In one or more embodiments, the metal layer MTL may also be formed on both side surfaces of the lift off layer PR. However, when the metal layer MTL is formed by a sputtering process, the metal layer MTL formed on the lift off layer PR may have a thin thickness and thus may be easily removed in a subsequent process.

Figure 16:
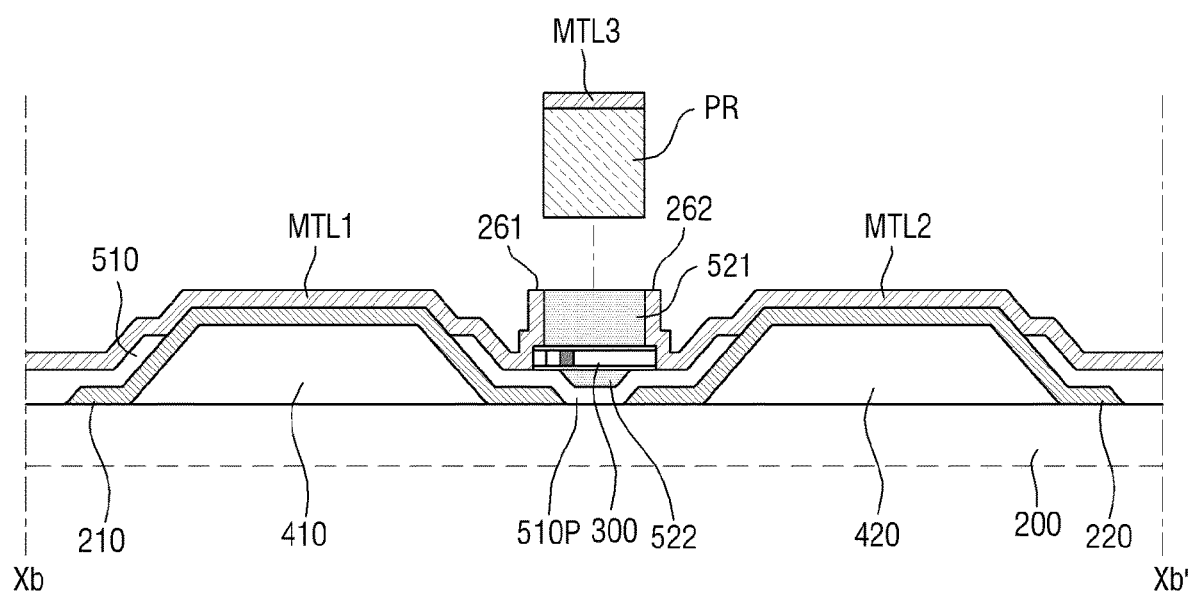

Next, referring to FIG. 16, the lift off layer PR is removed. The third metal layer MTL3 may be removed simultaneously with the lift off layer PR, and the first upper surface 521U of the second insulating pattern 521 may be exposed. Because the lift off layer PR is on the first upper surface 521U of the second insulating pattern 521, the metal layer MTL is not formed there. Accordingly, the contact electrodes 261 and 262 may not be present on the first upper surface 521U exposed by removing the lift off layer PR. The first contact electrode 261 and the second contact electrode 262 may be respectively in contact with the first side surface and the second side surface of the second insulating pattern 521 to form the first contact surface CS1 and the second contact surface CS2. A description thereof is the same as the above description. Then, the display device 10 may be fabricated by forming the passivation layer 550 on the entirety of the via layer 200.

The method of fabricating the display device 10 according to one embodiment may simultaneously (or concurrently) form the first contact electrode 261 and the second contact electrode 262 in one process using a lift-off process. Thus, the first upper surface 521U of the second insulating pattern 521, which is exposed by removing the lift off layer PR, may be coplanar with the second upper surface 261U of the first contact electrode 261 and the third upper surface 262U of the second contact electrode 262. Further, according to one embodiment, the method of fabricating the display device 10 may reduce the number of processes required to form the contact electrodes 261 and 262 and may prevent (or reduce) a contact failure between the contact electrodes 261 and 262 and both end portions of the light emitting element 300.

In some embodiments, in a region in which the light emitting element 300 is not positioned between the first electrode 210 and the second electrode 220, the second insulating pattern 521 and the third insulating pattern 522 of the second insulating layer 520 may be in contact with each other.

Figure 17:
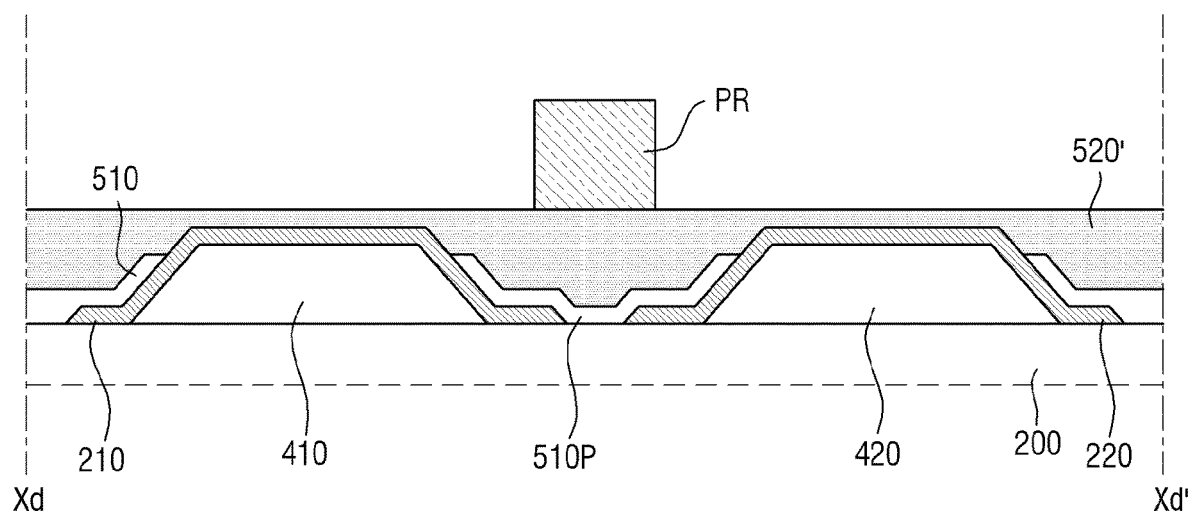
Figure 18:
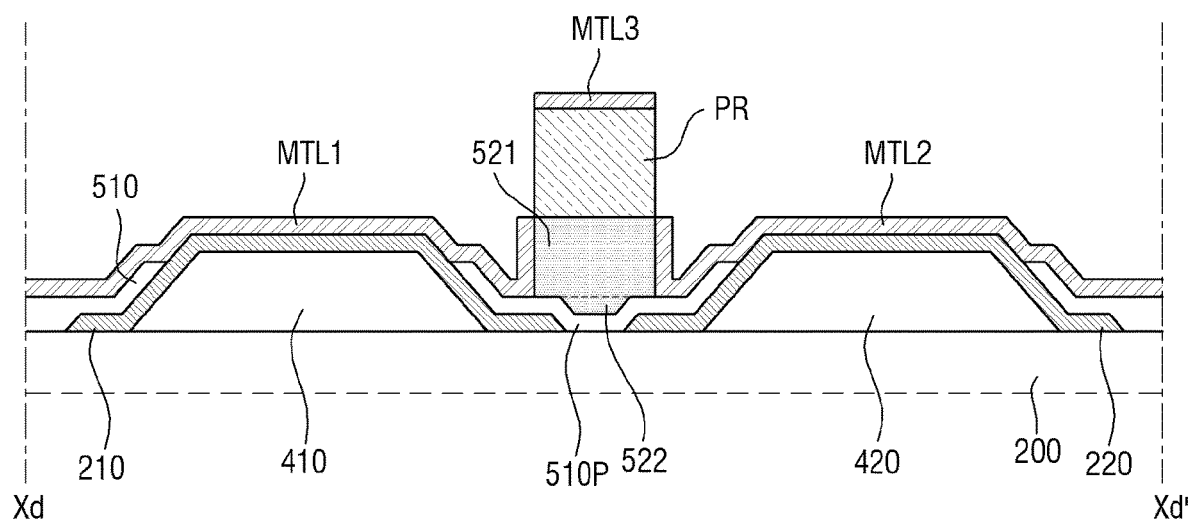

Referring to FIGS. 17 and 18, in the second insulating layer 520, which is formed by patterning the second insulator layer 520', the second insulating pattern 521 may be directly on the first insulating pattern 510P and may be in contact with the third insulating pattern 522, which is formed in the recessed space of the first insulating pattern 510P. For example, the lower surface of the second insulating pattern 521 may be in contact with the first insulating pattern 510P and the third insulating pattern 522. A detailed description thereof is the same as described above.

In some embodiments, the second upper surface 261U of the first contact electrode 261 and the third upper surface 262U of the second contact electrode 262 may not be coplanar with the first upper surface 521U of the second insulating pattern 521.

Figure 19:
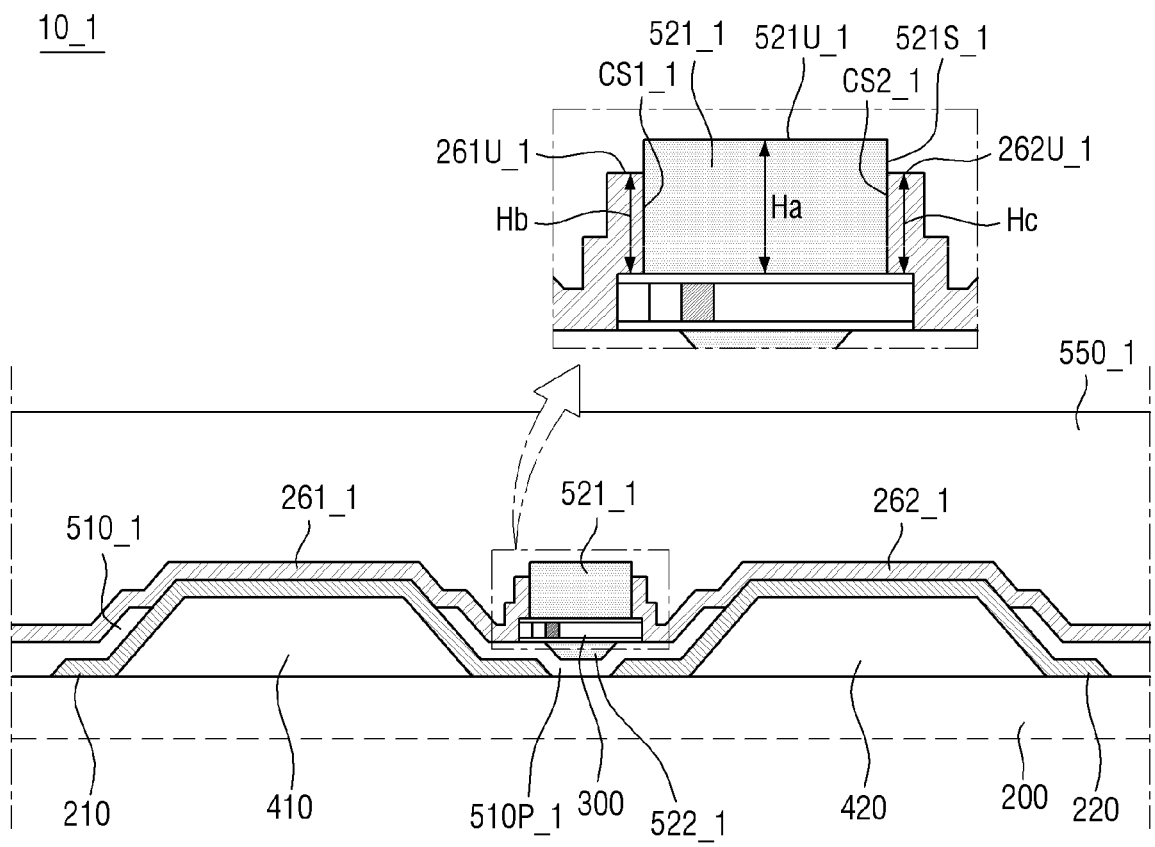
FIG. 19 is a cross-sectional view illustrating a portion of a display device according to another embodiment.
Figure 20:
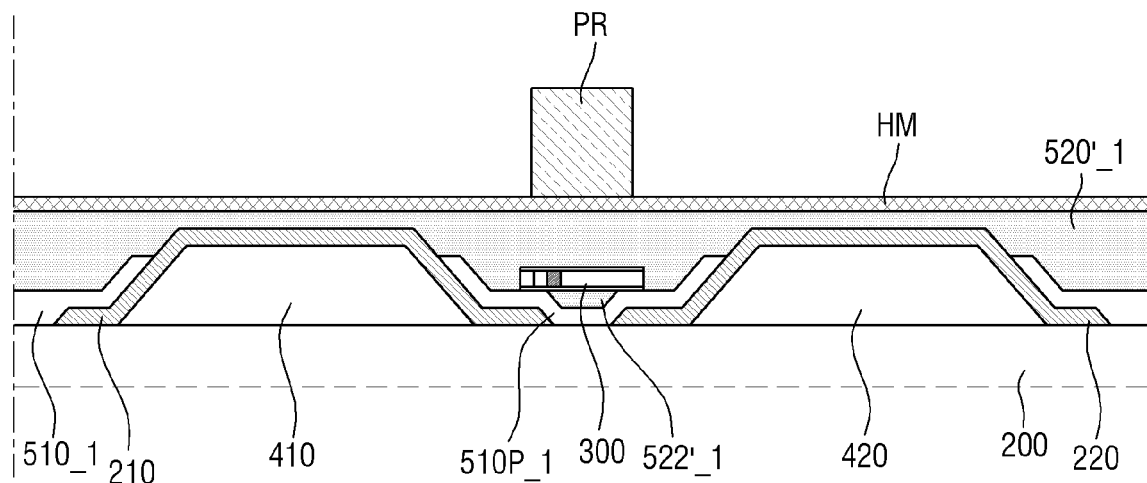
FIGS. 20-23 are cross-sectional views illustrating a process of fabricating the display device of FIG. 19.

FIG. 19 is a cross-sectional view illustrating a portion of a display device according to another embodiment.

Referring to FIG. 19, in a display device 10_1 according to one embodiment, at least one of a second upper surface 261U_1 of a first contact electrode 261_1 and a third upper surface 262U_1 of a second contact electrode 262_1 may be spaced apart from a reference surface which is formed by a first upper surface 521U_1 of a second insulating pattern 521_1. The present embodiment is different from the embodiment of FIG. 5 in that a portion in which the second insulating pattern 521_1, the first contact electrode 261_1, and the second contact electrode 262_1 are not coplanar with each other is not included in the embodiment of FIG. 5. Hereinafter, a duplicative description will not be repeated and, instead, the following description will focus on differences of the embodiments being described from the embodiments already described herein above.

In the display device 10_1 of FIG. 19, the first upper surface 521U_1 of the second insulating pattern 521_1 may be spaced apart from the second upper surface 261U_1 of the first contact electrode 261_1 and the third upper surface 262U_1 of the second contact electrode 262_1. When a reference surface formed by the first upper surface 521U_1 is defined, the second upper surface 261U_1 and the third upper surface 262U_1 may be spaced apart from the reference surface. As shown in the drawing, a height Ha of the second insulating pattern 521_1 (measured from the light emitting element 300 to the first upper surface 521U_1) may be greater than each of a height Hb of the first contact electrode 261_1 (measured from the light emitting element 300 to the second upper surface 261U_1) and a height Hc of the second contact electrode 262_1 (measured from the light emitting element 300 to the third upper surface 262U_1). Consequently, the second insulating pattern 521_1 may include an exposed surface (portion) 521S_1, of which both side surfaces are not in contact with the contact electrodes 261_1 and 262_1. The first upper surface 521U_1, the second upper surface 261U_1, and third upper surface 262U_1 may be substantially parallel to each other, but a step may be formed therebetween. The first upper surface 521U_1 of the second insulating pattern 521_1 may be formed at a higher position than the first contact electrode 261_1 and the second contact electrode 262_1, relative to the light emitting element 300.

Such a structure of the display device 10_1 may be formed, during the fabricating process, by further arranging a hard mask layer HM between a second insulator layer 520'_1 and a lift off layer PR.

FIGS. 20 to 23 are cross-sectional views illustrating a process of fabricating the display device of FIG. 19.

Figure 21:
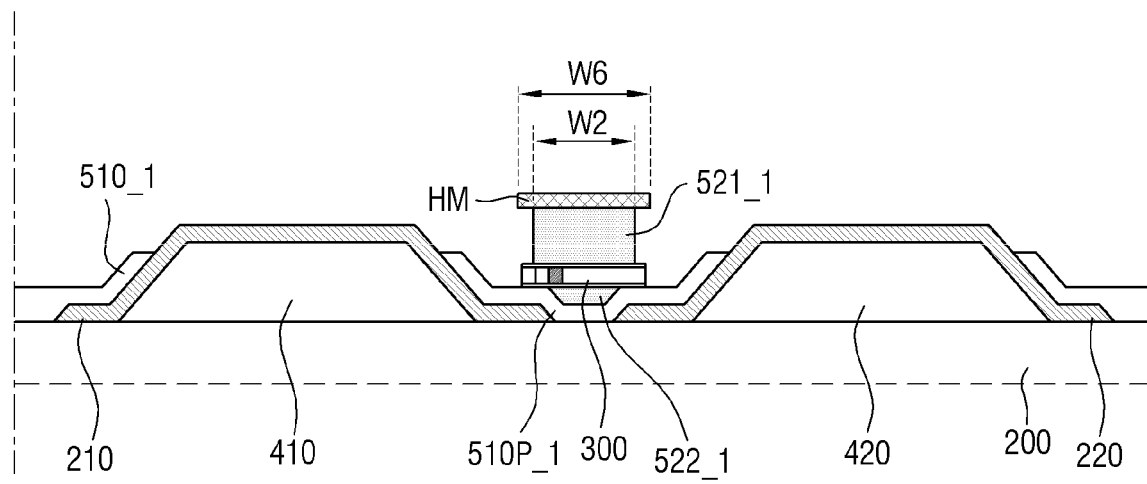

Referring to FIGS. 20 to 23, in the method of fabricating the display device 10_1, the hard mask layer HM may be further formed between a second insulator layer 520'_1 and the lift off layer PR. The hard mask layer HM may include a material having an etch selectivity with respect to the second insulator layer 520'_1. When the hard mask layer HM and the second insulator layer 520'_1 are etched along the lift off layer PR, the hard mask layer HM may remain with the same width as the lift off layer PR, whereas the second insulator layer 520'_1 may remain with a width that is smaller than that of the lift off layer PR. For example, as shown in FIG. 21, a width W2 of the second insulating pattern 521_1 may be smaller than a width W6 of the hard mask layer HM, which remains after being etched. Then, in formation of a metal layer MTL_1, a portion of a side surface of the second insulating pattern 521_1 may be covered by the hard mask layer HM, and a material constituting the metal layer MTL_1 may not be deposited on that portion.

Figure 22:
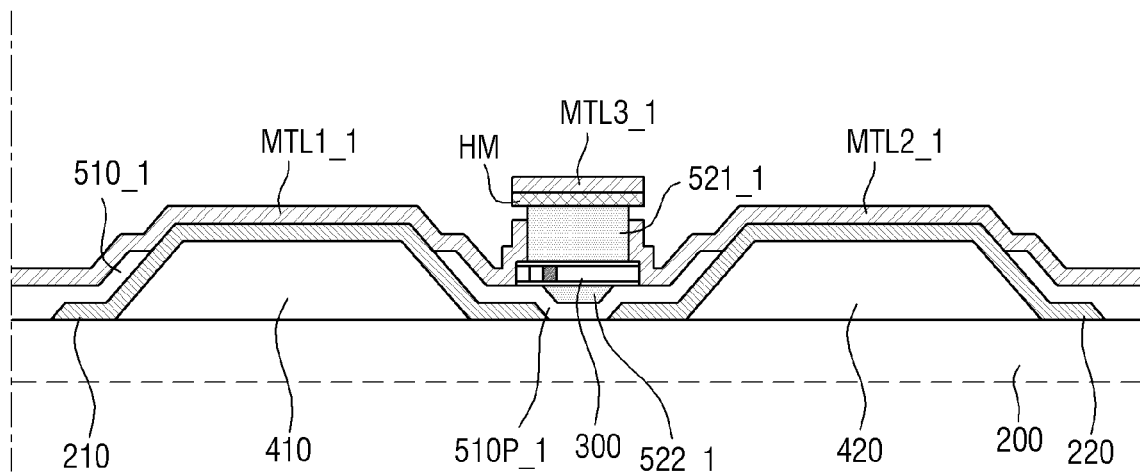
Figure 23:
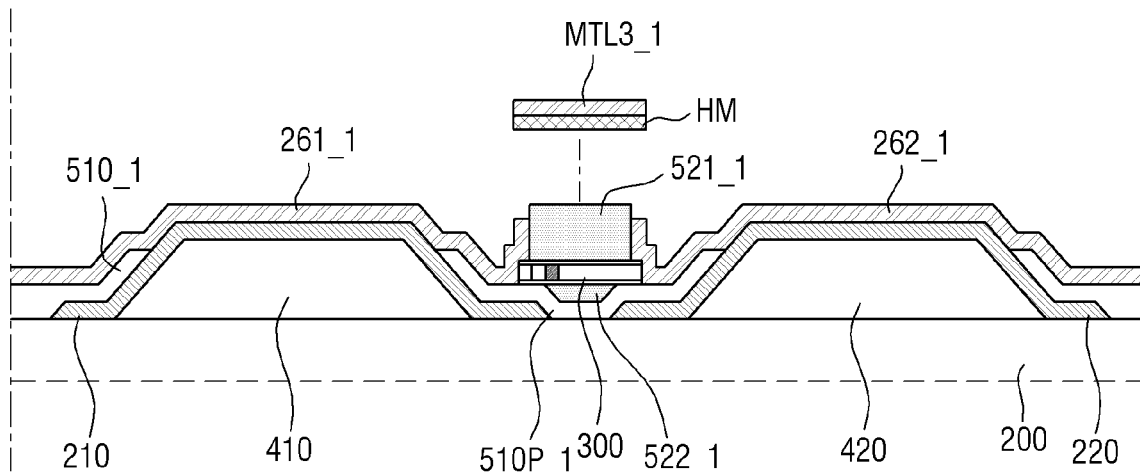

As shown in FIG. 22, a first metal layer MTL1_1 and a second metal layer MTL2_1 may be deposited on only a portion of the side surface of the second insulating pattern 521_1, and the first metal layer MTL1_1 and the second metal layer MTL2_1 may not be formed in portions adjacent to the hard mask layer HM. A third metal layer MTL3_1 may be formed on the hard mask layer HM and, as shown in FIG. 23, the third metal layer MTL3_1 may be removed together with the hard mask layer HM. After the hard mask layer HM is removed, the first metal layer MTL1_1 and the second metal layer MTL2_1 may respectively form the first contact electrode 261_1 and the second contact electrode 262_1, and regions of both side surfaces of the second insulating pattern 521_1 in which the materials constituting the metal layer MTL_1 are not deposited may be exposed.

Since the process of fabricating the display device 10_1 of FIG. 19 may include a process of forming the hard mask layer HM, some portions of both side surfaces of the second insulating pattern 521_1 may not be in contact with the first contact electrode 261_1 and the second contact electrode 262_1.

Figure 24:
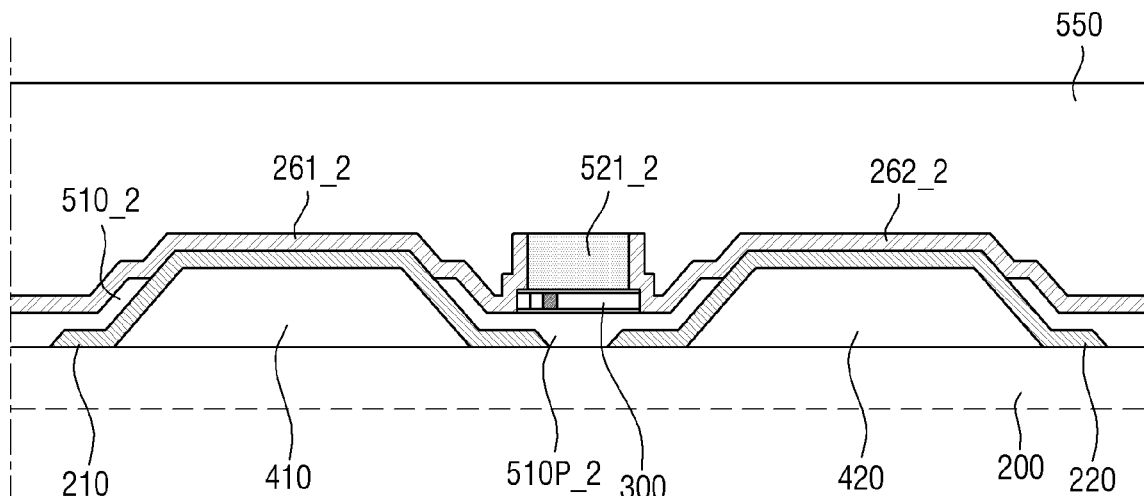
FIG. 24 is a cross-sectional view illustrating a portion of a display device according to still another embodiment.

FIG. 24 is a cross-sectional view illustrating a portion of a display device according to yet another embodiment.

Referring to FIG. 24, in a display device 10_2 according to one embodiment, a third insulating pattern 522_2 of a second insulating layer 520 may be omitted. One side surface of a light emitting element 300 on a first insulating pattern 510P_2 in a cross section may be entirely in contact with the first insulating pattern 510P_2. The embodiment of FIG. 24 is different from the embodiment of FIG. 5 in that the third insulating pattern 522_2 is omitted. A description of other configurations, except for the above description, is the same as described above, and thus, a duplicative description of features described herein above will not be repeated here.

The display device 10 may include more insulating layers, in addition to those described herein. According to one embodiment, the display device 10 may further include a third insulating layer 530 formed to protect the first contact electrode 261.

Figure 25:
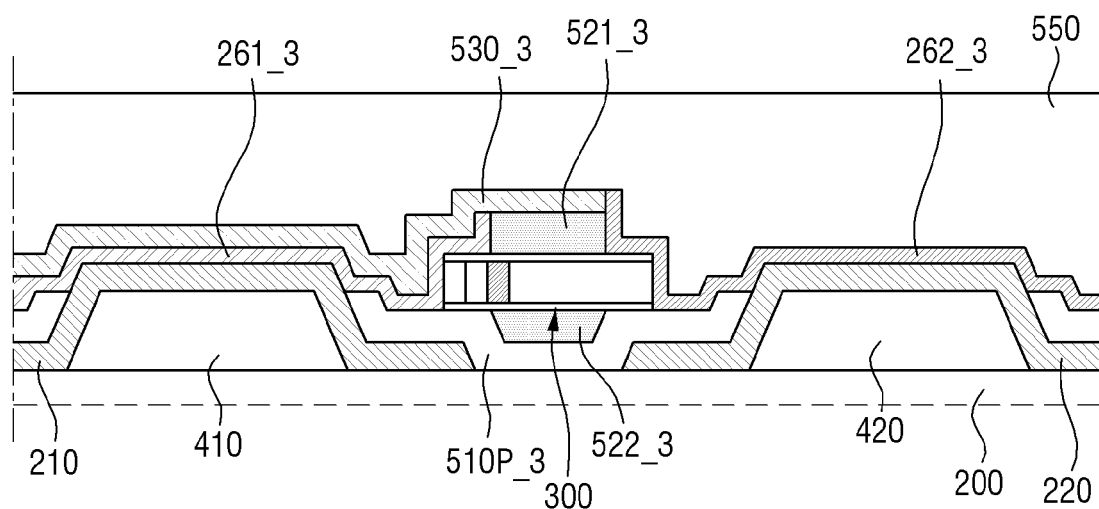
FIG. 25 is a cross-sectional view illustrating a portion of a display device according to yet another embodiment.

FIG. 25 is a cross-sectional view illustrating a portion of a display device according to yet another embodiment.

Referring to FIG. 25, a display device 10_3 according to one embodiment may further include a third insulating layer 530_3 on a first contact electrode 261_3. The display device 10_3 according to the present embodiment is different from the display device 10 of FIG. 4 in that the third insulating layer 530_3 is further included so that a second contact electrode 262_3 is in contact with the third insulating layer 530_3 (e.g., in contact with a side surface of the third insulating layer 530_3). Hereinafter, a duplicative description of the elements already described in connection with FIG. 4 will not be repeated here, and the following description will focus on a difference between the embodiment being described and that of FIG. 4.

The display device 10_3 of FIG. 25 may be include the first contact electrode 261_3 and the third insulating layer 530_3, which electrically insulates the first contact electrode 261_3 from the second contact electrode 262_3. The third insulating layer 530_3 may cover the first contact electrode 261_3 and a second insulating pattern 521_3 of a second insulating layer 520. The third insulating layer 530_3 may be in contact with the first contact electrode 261_3 and the second contact electrode 262_3 on an upper surface of the second insulating pattern 521_3. A lower surface of the third insulating layer 530_3 may be in contact with an upper surface of the first contact electrode 261_3 and the upper surface of the second insulating pattern 521_3. One side surface of the third insulating layer 530_3 may be in contact with the second contact electrode 262_3.

In the display device 10_3, the first contact electrode 261_3 and the second contact electrode 262_3 may be formed using a lift-off process. In the display device 10_3 according to the present embodiment, the first contact electrode 261_3 and the second contact electrode 262_3 may be formed through different lift-off processes. When the first contact electrode 261_3 is formed together with the second insulating layer 520 in the same lift-off process, the upper surface of the first contact electrode 261_3 may be coplanar with the upper surface of the second insulating pattern 521_3 of the second insulating layer 520. The first contact electrode 261_3 may be in contact with one side surface of the second insulating pattern 521_3 and one end portion of a light emitting element 300. When the second contact electrode 262_3 is formed together with the third insulating layer 530_3 in the same lift-off process, an upper surface of the second contact electrode 262_3 may be coplanar with an upper surface of the third insulating layer 530_3. The second contact electrode 262_3 may be in contact with the other side surface of the second insulating pattern 521_3, one side surface of the third insulating layer 530_3, and the other end portion of the light emitting element 300.

The third insulating layer 530_3 may be between the first contact electrode 261_3 and the second contact electrode 262_3 to electrically insulate the first contact electrode 261_3 from the second contact electrode 262_3. The one side surface of the third insulating layer 530_3, which is in contact with the second contact electrode 262_3, may be mutually arranged (e.g., aligned) with the other side surface of the second insulating pattern 521_3 (which is in contact with the second contact electrode 262_3). For example, the one side surface of the third insulating layer 530_3 may be coplanar with the other side surface of the second insulating pattern 521_3. In some embodiments, the third insulating layer 530 may include an inorganic insulating material, as in a first insulating layer 510.

A passivation layer 550 may be formed to protect the third insulating layer 530 and a second contact electrode 262. A duplicative description thereof will not be repeated here.

According to some embodiments, in a first electrode 210 and a second electrode 220, electrode stem 210S and 220S extending in the first direction DR1 may be omitted.

Figure 26:
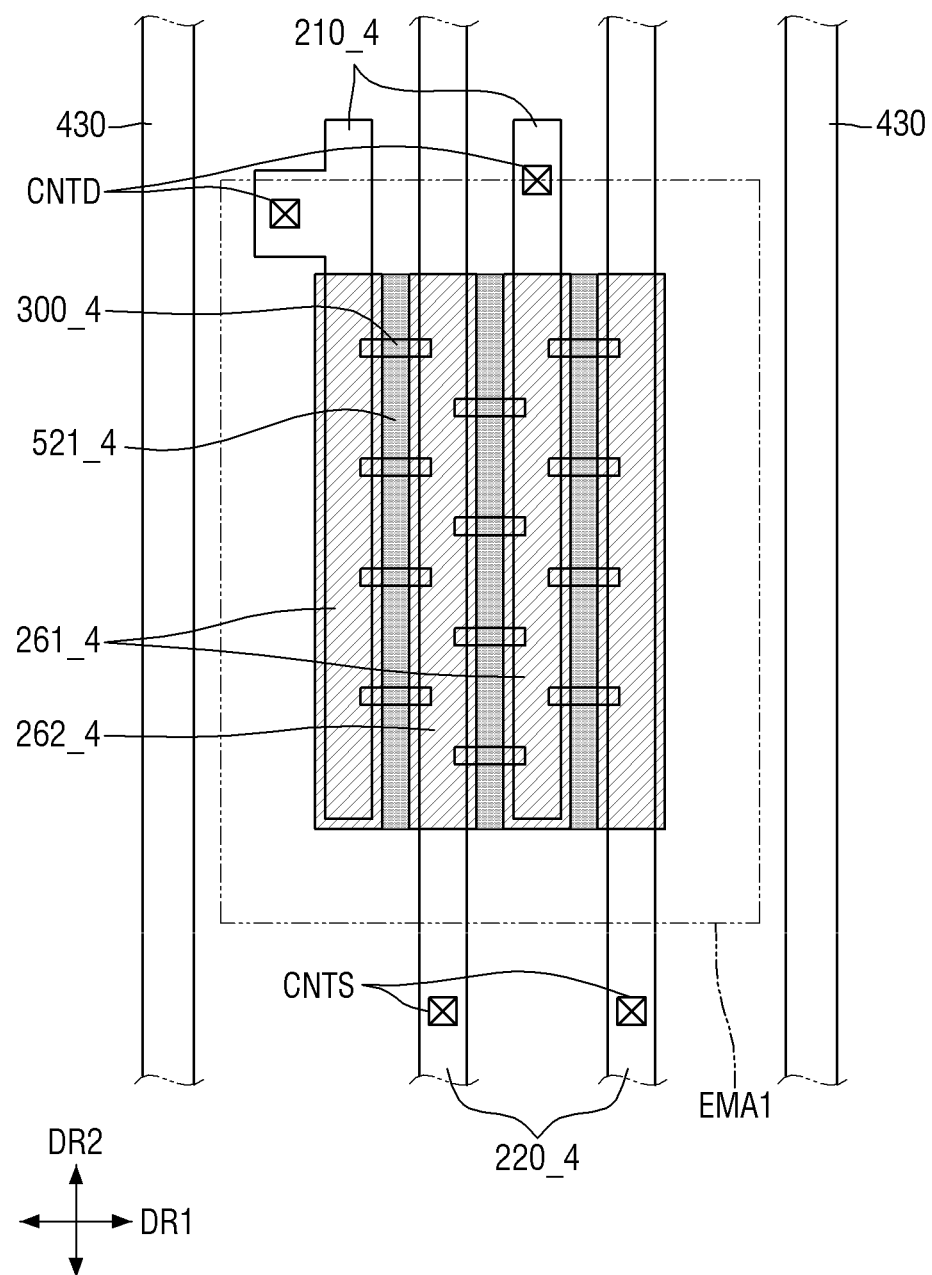
FIG. 26 is a plan view of one sub-pixel of the display device according to another embodiment.

FIG. 26 is a plan view of one sub-pixel of the display device according to another embodiment.

Referring to FIG. 26, in a display device 10_4, a first electrode 210_4 and a second electrode 220_4 may extend in one direction, e.g., the second direction DR2. In the first electrode 210_4 and the second electrode 220_4, electrode stem 210S and 220S extending in the first direction DR1 may be omitted. The display device 10_4 of FIG. 26 is different from the display device 10 of FIG. 2 in that the electrode stem 210S and 220S are omitted and one additional second electrode 220_4 is further included. Hereinafter, a duplicative description of the elements described in connection with FIG. 2 will not be repeated here, and the following description will focus on differences between the embodiment being described and that of FIG. 2.

As shown in FIG. 26, a plurality of first electrodes 210_4 and a plurality of second electrodes 220_4 may extend in the second direction DR2 in each sub-pixel PXn. An outer bank 430 may also extend in the second direction DR2. The second electrode 220_4 and the outer bank 430 may extend to another sub-pixel PXn adjacent thereto in the second direction DR2. Thus, sub-pixels PXn which are adjacent in the second direction DR2 may receive the same electrical signal from the second electrode 220_4.

Unlike the display device 10 of FIG. 2, in the display device 10_4 of FIG. 26, a second electrode contact hole CNTS may be formed in each of the second electrodes 220_4. The second electrode 220 may be electrically connected to a power electrode 162 of a circuit element layer PAL through the second electrode contact hole CNTS which is located in each sub-pixel PXn.

The first electrode 210_4 may be formed to extend in the second direction DR2 to a boundary of each sub-pixel PXn. The sub-pixels PXn which are adjacent in the second direction DR2 may include the first electrodes 210_4 spaced apart from each other, and the first electrodes 210_4 may receive different electrical signals through first electrode contact holes CNTD. A shape of the first electrode 210_4 may be formed by forming the first electrode 210_4 to extend in the second direction DR2 and then disconnecting (e.g., breaking up) the first electrodes 210_4 at a boundary between adjacent sub-pixels PXn during the process of fabricating the display device 10.

The outer bank 430 may be at the boundary between adjacent sub-pixels PXn in the first direction DR1 and may extend in the second direction DR2. In some embodiments, the outer bank 430 may be at the boundary between adjacent sub-pixels PXn in the second direction DR2 and may extend in the first direction DR1. A description of the outer bank 430 is the same as the above description given with reference to FIG. 3. Further, a first contact electrode 261_4 and a second contact electrode 262_4, which are included in the display device 10_4 of FIG. 26, are substantially the same as those of the display device 10 of FIG. 3.

In FIG. 26, two first electrodes 210_4 and two second electrodes 220_4 have been illustrated as being alternately positioned and spaced apart from each other. However, the present disclosure is not limited thereto, and some electrodes may be omitted from the display device 10_4 or a larger number of electrodes may be formed therein.

In the embodiment of FIG. 26, a plurality of insulating patterns may be positioned between the first electrode 210_4 and the second electrode 220_4. Although only a second insulating pattern 521_4 has been illustrated in the drawing, a first insulating pattern 510P and a third insulating pattern 522 may also be formed to overlap the second insulating pattern 521_4. The second insulating pattern 521_4 may extend in the second direction DR2 to be between the first electrode 210_4 and the second electrode 220_4 and, like the first electrode 210_4, may be formed to extend to a boundary of each sub-pixel PXn. For example, a length of the second insulating pattern 521_4 measured in the second direction DR2 may be the same as that of the first electrode 210_4 measured in the second direction DR2. However, the present disclosure is not limited thereto, and, like the second electrode 220_4, the second insulating pattern 521_4 may also extend to another sub-pixel PXn adjacent thereto in the second direction DR2 to form a linear pattern on a front surface of the display device 10_4.

The structure of a light emitting element 300 is not limited to that shown in FIG. 7, and the light emitting element 300 may have another structure.

Figure 27:
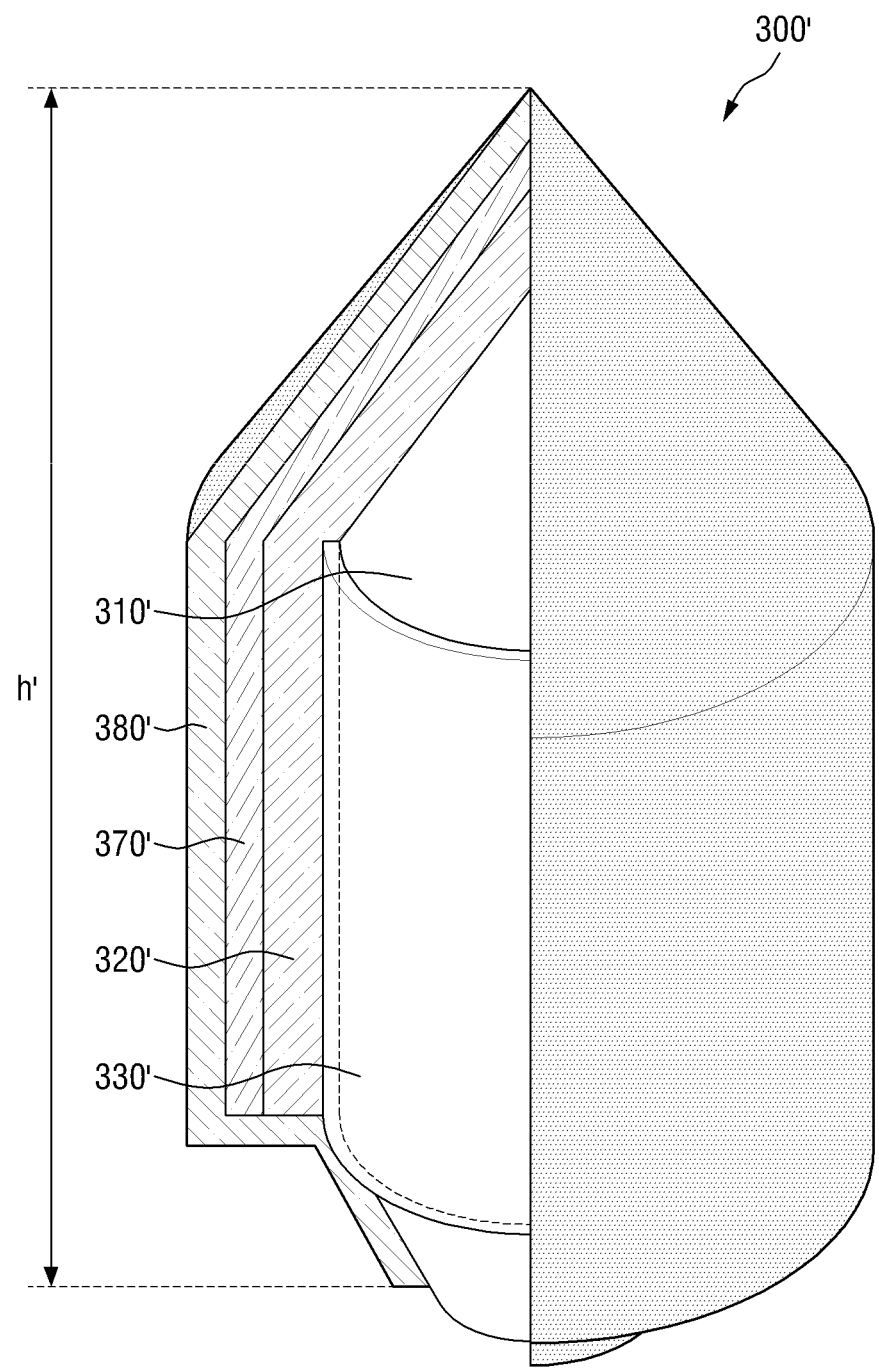
FIG. 27 is a schematic view of a light emitting element according to another embodiment.
Figure 28:
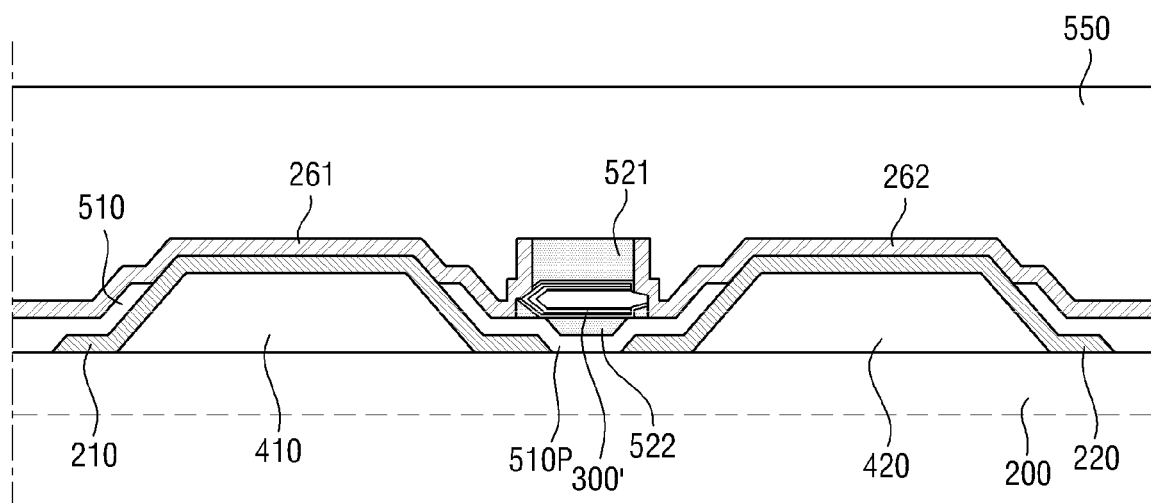
FIG. 28 is a cross-sectional view illustrating a portion of a display device including the light emitting element of FIG. 27.

FIG. 27 is a schematic view of a light emitting element according to another embodiment. FIG. 28 is a cross-sectional view illustrating a portion of a display device including the light emitting element of FIG. 27.

Referring to FIG. 27 first, a light emitting element 300' may have a shape extending in one direction and having a partially inclined side surface. For example, the light emitting element 300' according to one embodiment may have a partially conical shape.

The light emitting element 300' may be formed such that a plurality of layers are not stacked in one direction, and each of the plurality of layers surrounds an outer surface of another layer. The light emitting element 300' of FIG. 27 may be formed such that a plurality of semiconductor layers surround at least a portion of an outer surface of another layer. The light emitting element 300' may include a semiconductor core, of which at least portion partially extends in one direction, and an insulating layer 380' formed to surround the semiconductor core. The semiconductor core may include a first semiconductor layer 310', an active layer 330', a second semiconductor layer 320', and an electrode layer 370'. The light emitting element 300' of FIG. 27 is the same as the light emitting element 300 of FIG. 7 except that shapes of the constituting layers are partially different. Hereinafter, duplicative content will not be repeated and the description will focus on differences between the embodiments being described and those described herein above.

According to one embodiment, the first semiconductor layer 310' may extend in one direction and both end portions thereof may be formed to be inclined (e.g., narrowed) toward a central portion thereof. The first semiconductor layer 310' of FIG. 27 may have a rod-shaped or cylindrical main body and end portions having inclined side surfaces on upper and lower portions of the main body. An upper end portion of the main body may have a slope that is steeper than that of a lower end portion thereof.

The active layer 330' may surround an outer surface of the main body of the first semiconductor layer 310'. The active layer 330' may have an annular shape extending in one direction. The active layer 330' may not be formed on upper and lower end portions of the first semiconductor layer 310'. The active layer 330' may be formed on only a non-inclined side surface of the first semiconductor layer 310'. However, the present disclosure is not limited thereto. Accordingly, light emitted from the active layer 330' may be emitted to not only both end portions of the light emitting element 300' in a length direction but also both side surfaces thereof based on (along) the length direction. When compared with the light emitting element 300 of FIG. 7, the light emitting element 300' of FIG. 27 may include the active layer 330' having a larger area, thereby emitting a larger amount of light.

The second semiconductor layer 320' may surround an outer surface of the active layer 330' and the upper end portion of the first semiconductor layer 310'. The second semiconductor layer 320' may include an annular main body extending in one direction and an upper end portion having an inclined side surface. For example, the second semiconductor layer 320' may be in direct contact with a side surface of the active layer 330' parallel thereto and the inclined upper end portion of the first semiconductor layer 310'. However, the second semiconductor layer 320' is not formed in the lower end portion of the first semiconductor layer 310'.

The electrode layer 370' may surround an outer surface of the second semiconductor layer 320'. For example, a shape of the electrode layer 370' may be substantially the same as that of the second semiconductor layer 320'. In some embodiments, the electrode layer 370' may be in full contact with the outer surface of the second semiconductor layer 320'.

The insulating layer 380' may surround outer surfaces of the electrode layer 370' and the first semiconductor layer 310'. The insulating layer 380' may be in direct contact with the electrode layer 370', the lower end portion of the first semiconductor layer 310' and exposed lower end portions of the active layer 330', and the second semiconductor layer 320'.

FIG. 28 is a partial cross-sectional view of a display device 10 including the light emitting element 300' of FIG. 27. FIG. 28 shows a portion of area Xb-Xb' of FIG. 4. Referring to FIG. 28, the display device 10 according to one embodiment may include the light emitting element 300' of FIG. 27. The display device 10 of FIG. 28 is the same as the display device 10 of FIG. 4 except that a structure of the light emitting element 300' is different. Hereinafter, a duplicate description of the elements described in connection with FIG. 4 will not be repeated here, and the following description will focus on differences between the embodiments being described and those of FIG. 4.

As described above, the light emitting element 300' may include a plurality of layers and may be between the first electrode 210 and the second electrode 220. The plurality of layers of the light emitting element 300' may be arranged in a direction parallel to the via layer 200 (e.g., to the extension direction of the via layer 200). According to one embodiment, the light emitting element 300' may be positioned such that the via layer 200 is parallel to a direction in which the main body of the first semiconductor layer 310' extends. In the light emitting element 300', the insulating layer 380', the electrode layer 370', the second semiconductor layer 320', the active layer 330', and the first semiconductor layer 310' may be sequentially arranged on the first insulating layer 510 in a direction crossing (e.g., perpendicular to) the via layer 200. Further, because each layer of the light emitting element 300' is formed to surround an outer surface of another layer, the light emitting element 300' on the display device 10 may have a symmetrical structure based on (relative to) the first semiconductor layer 310'. For example, the light emitting element 300' may have a shape in which the active layer 330', the second semiconductor layer 320', the electrode layer 370', and the insulating layer 380' may be sequentially stacked in a direction crossing (e.g., perpendicular to) the via layer 200 based on (relative to) the first semiconductor layer 310'. However, the present disclosure is not limited thereto. The order in which the plurality of layers of the light emitting element 300' are arranged may be reversed. In some cases, when the light emitting element 300' has another structure, the plurality of layers may be arranged in a direction parallel to the via layer 200.

In the display device 10 of FIG. 28, a portion of the insulating layer 380' of the light emitting element 300' may be removed, and the electrode layer 370' and the first semiconductor layer 310' may be partially exposed. In the formation of the second insulating layer 520 during the process of fabricating the display device 10, the insulating layer 380' may be partially removed. The exposed region of the electrode layer 370' may be in contact with the first contact electrode 261, and the exposed region of the first semiconductor layer 310' may be in contact with the second contact electrode 262.

Further, the light emitting element 300' may include a first end portion having an inclined side surface based on the main body and a second end portion having a diameter that is smaller than that of the main body. In the light emitting element 300' positioned on the first insulating layer 510, the side surface of the main body may be in partial contact with the first insulating layer 510, e.g., the first insulating pattern 510P, and the first end portion and the second end portion of the light emitting element 300' may be spaced apart from the first insulating pattern 510P. The second insulating layer 520 may be further positioned in a region in which the main body of the light emitting element 300', the first end portion, and the second end portion are spaced apart from the first insulating pattern 510P. A description of other configurations is the same as described above, and thus, a duplicative description of features described herein above will not be repeated here.

A method of fabricating a display device according to the embodiments can include forming a plurality of contact electrodes by performing a single lift off process. The method of fabricating a display device can reduce the number of processes of forming the contact electrode and secure a contact area of the contact electrodes in contact with a light emitting element by adjusting a width of a lift off layer.

Further, a display device according to the embodiments can include a plurality of insulating patterns, and the insulating patterns on the light emitting element can include upper surfaces coplanar with the contact electrodes. The contact electrodes are not formed on the upper surfaces of the insulating patterns, and only side surfaces of the insulating patterns can be in contact with the contact electrodes.

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While the present disclosure has been described with reference to some example embodiments thereof, those skilled in the art will appreciate that many variations and modifications can be made to the preferred embodiments without substantially departing from the principles of the present disclosure. Therefore, the disclosed embodiments are used in a generic and descriptive sense only and not for purposes of limitation. The spirit and scope of the present disclosure is set forth in the following claims and their equivalents.

What is claimed is:

1. A method of fabricating a display device, the method comprising:
    forming a first electrode and a second electrode on a substrate,
    forming a light emitting element on the first electrode and the second electrode,
    forming an insulating layer on the light emitting element;

forming a lift off layer on the insulating layer and patterning the insulating layer to form an insulating pattern on the light emitting element;

forming a metal layer on the first electrode, the second electrode, and the lift off layer, removing the lift off layer, and forming a first contact electrode in contact with one side surface of the insulating pattern and a second contact electrode in contact with another side surface of the insulating pattern, wherein the insulating pattern comprises a first upper surface not in contact with the first contact electrode or the second contact electrode.

2. The method of claim 1, wherein the first contact electrode is in contact with the first electrode and one end portion of the light emitting element, and the second contact electrode is in contact with the second electrode and another end portion of the light emitting element.

3. The method of claim 2, wherein an upper surface of the insulating pattern is not in contact with the first contact electrode or the second contact electrode.

4. The method of claim 3, wherein:

the forming of the lift off layer further comprises forming a hard mask layer between the insulating layer and the lift off layer; and the insulating pattern comprises a region in which the one side surface and the other side surface are exposed and are not in contact with the first contact electrode or the second contact electrode.

* * * * *